(12) United States Patent
Kim et al.

(10) Patent No.: US 11,018,173 B2
(45) Date of Patent: May 25, 2021

(54) IMAGE SENSOR

(71) Applicant: SAMSUNG ELECTRONICS CO., LTD., Suwon-si (KR)

(72) Inventors: Ji-hwang Kim, Cheonan-si (KR); Kyung-suk Oh, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/251,368

(22) Filed: Jan. 18, 2019

(65) Prior Publication Data

US 2019/0386050 A1    Dec. 19, 2019

(30) Foreign Application Priority Data

Jun. 18, 2018 (KR) .................. 10-2018-0069629

(51) Int. Cl.
    *H01L 27/146* (2006.01)
(52) U.S. Cl.
    CPC .... *H01L 27/14627* (2013.01); *H01L 27/1463* (2013.01); *H01L 27/14621* (2013.01); *H01L 27/14643* (2013.01); *H01L 27/14685* (2013.01); *H01L 27/14689* (2013.01)
(58) Field of Classification Search
    CPC ........ H01L 27/14627; H01L 27/14621; H01L 27/1463; H01L 27/14643; H01L 27/14685; H01L 27/14689; H01L 27/1464; H01L 27/14607; H01L 27/14605
    See application file for complete search history.

(56) References Cited

U.S. PATENT DOCUMENTS

| | | | |
|---|---|---|---|
| 5,306,906 A | 4/1994 | Aoki et al. | |
| 5,793,482 A | 8/1998 | Tseng et al. | |
| 6,687,149 B2 | 2/2004 | Chernobrod et al. | |
| 6,796,697 B1 | 9/2004 | Bragg et al. | |
| 6,838,715 B1 | 1/2005 | Bencuya et al. | |
| 7,282,686 B2 | 10/2007 | Ahn | |

(Continued)

FOREIGN PATENT DOCUMENTS

| | | |
|---|---|---|
| JP | H07-74332 | 3/1995 |
| JP | 2017-034280 | 2/2017 |

(Continued)

OTHER PUBLICATIONS

European Partial Search Report issued in corresponding European Patent Application No. 19170956.7 dated Oct. 22, 2019.

(Continued)

*Primary Examiner* — Mohammed R Alam
(74) *Attorney, Agent, or Firm* — F. Chau & Associates, LLC

(57) ABSTRACT

An image sensor including: a semiconductor substrate having a first region and a second region; an isolation region filling an isolation trench that partially penetrates the semiconductor substrate; a plurality of photoelectric conversion regions defined by the isolation region and forming a first hexagonal array on a plane that is parallel to a surface of the semiconductor substrate; and a plurality of microlenses respectively corresponding to the plurality of photoelectric conversion regions, and forming a second hexagonal array on the plane that is parallel to the surface of the semiconductor substrate.

4 Claims, 19 Drawing Sheets

(56) References Cited

U.S. PATENT DOCUMENTS

| | | |
|---|---|---|
| 7,544,982 B2 | 6/2009 | Yu et al. |
| 7,709,872 B2 | 5/2010 | Shiau et al. |
| 7,776,632 B2 | 8/2010 | Park |
| 7,825,970 B2 | 11/2010 | Choi et al. |
| 7,888,159 B2 | 2/2011 | Venezia et al. |
| 8,263,386 B2 | 9/2012 | Yoo |
| 8,338,900 B2 | 12/2012 | Venezia et al. |
| 8,704,934 B2 | 4/2014 | Yokogawa |
| 8,889,461 B2 | 11/2014 | Jangjian et al. |
| 9,279,818 B2 | 3/2016 | Yoo |
| 9,324,756 B2 | 4/2016 | Yu et al. |
| 9,368,540 B2 | 6/2016 | Jangjian et al. |
| 9,525,005 B2 | 12/2016 | Tu |
| 9,559,135 B2 | 1/2017 | Li et al. |
| 9,793,310 B2 | 10/2017 | Ihara et al. |
| 9,806,116 B2 | 10/2017 | Tsai et al. |
| 9,954,022 B2 | 4/2018 | Chen et al. |
| 2007/0007559 A1 | 1/2007 | Lee et al. |
| 2007/0166649 A1 | 7/2007 | Yu |
| 2008/0018765 A1 | 1/2008 | Choi et al. |
| 2008/0186512 A1 | 8/2008 | Kee et al. |
| 2009/0155176 A1 | 6/2009 | Burnier et al. |
| 2010/0328243 A1 | 12/2010 | Wang et al. |
| 2011/0221947 A1 | 9/2011 | Awazu |
| 2012/0081587 A1 | 4/2012 | Ryu |
| 2014/0050779 A1 | 2/2014 | Beuerman et al. |
| 2014/0246707 A1 | 9/2014 | Koo et al. |
| 2015/0243697 A1* | 8/2015 | Chien ................ H01L 27/1463 257/432 |
| 2015/0255498 A1 | 9/2015 | Sugiura |
| 2015/0319351 A1* | 11/2015 | Iwane ............... H01L 27/14627 348/335 |
| 2016/0049430 A1* | 2/2016 | Nomura ............. H01L 27/1464 257/432 |
| 2016/0064430 A1* | 3/2016 | Lee ........................ H04N 5/335 348/302 |
| 2016/0240583 A1 | 8/2016 | Yu et al. |
| 2016/0268321 A1 | 9/2016 | Ihara et al. |
| 2017/0117315 A1 | 4/2017 | Chen et al. |
| 2018/0026061 A1 | 1/2018 | Tsai et al. |
| 2018/0069137 A1 | 3/2018 | Okamoto |
| 2018/0302597 A1* | 10/2018 | Honda ................ H01L 27/1463 |
| 2019/0148434 A1* | 5/2019 | Hsu .................. H01L 27/14627 257/432 |

FOREIGN PATENT DOCUMENTS

| | | |
|---|---|---|
| KR | 10-2009-0037604 | 4/2009 |
| KR | 10-1864481 | 6/2018 |

OTHER PUBLICATIONS

European Search Reporting issued in corresponding European Patent Application No. EP 19170956.7 dated Sep. 1, 2020.

First Written Opinion issued in corresponding Singapore Patent Appln No. 10201902421U dated Dec. 3, 2020.

* cited by examiner

IMAGE SENSOR

CROSS-REFERENCE TO RELATED APPLICATION

This application claims priority under 35 U.S.C. § 119 to Korean Patent Application No. 10-2018-0069629, filed on Jun. 18, 2018, in the Korean Intellectual Property Office, the disclosure of which is incorporated by reference herein in its entirety.

TECHNICAL FIELD

The inventive concept relates to an image sensor, and more particularly, to an image sensor having a microlens.

DISCUSSION OF RELATED ART

An image sensor captures light waves reflected off an object and converts the light waves into electrical signals to produce an image. The image sensor is used in consumer electronic products such as digital cameras, cameras for mobile phones, and portable camcorders, as well as in cameras that are mounted in vehicles, security devices, and robots.

In general, the image sensor is manufactured via a semiconductor manufacturing process. The image sensor may include a photo sensing device, a transistor configured to control the photo sensing device, and circuits configured to drive a pixel array. A backside-illuminated image sensor is a type of digital image sensor in which a transistor and a wiring layer are formed on one surface of a semiconductor layer where a photo sensing device is formed, and light is incident on the other surface of the semiconductor layer.

SUMMARY

According to an exemplary embodiment of the inventive concept, there is provided an image sensor including a semiconductor substrate having a first region and a second region; an isolation region filling an isolation trench that partially penetrates the semiconductor substrate; a plurality of photoelectric conversion regions defined by the isolation region and forming a first hexagonal array on a plane that is parallel to a surface of the semiconductor substrate; and a plurality of microlenses respectively corresponding to the plurality of photoelectric conversion regions, and forming a second hexagonal array on the plane that is parallel to the surface of the semiconductor substrate.

According to an exemplary embodiment of the inventive concept, there is provided an image sensor including a semiconductor substrate; an isolation region comprising an insulating liner and a conductive buried layer, wherein the insulating liner covers an inner wall of an isolation trench that penetrates the semiconductor substrate, and the conductive buried layer is disposed on the insulating liner in the isolation trench; a plurality of photoelectric conversion regions defined by the isolation region and forming a first hexagonal array on a plane that is parallel to a first surface of the semiconductor substrate; and a plurality of microlenses respectively corresponding to the plurality of photoelectric conversion regions, and forming a second hexagonal array on the plane that is parallel to the first surface of the semiconductor substrate.

According to an exemplary embodiment of the inventive concept, there is provided an image sensor including a semiconductor substrate; an isolation region filling an isolation trench that partially penetrates the semiconductor substrate; a plurality of photoelectric conversion regions defined by the isolation region and forming a first hexagonal array on a plane that is parallel to a first surface of the semiconductor substrate; a plurality of microlenses respectively corresponding to the plurality of photoelectric conversion regions, and forming a second hexagonal array on the plane that is parallel to the first surface of the semiconductor substrate; an inner wiring structure having a plurality of stacked layers on a second surface of the semiconductor substrate; and an interlayer insulating layer covering the inner wiring structure on the second surface of the semiconductor substrate, wherein respective centers, on the plane that is parallel to the first surface of the semiconductor substrate, of a first microlens and a first photoelectric conversion region, which corresponds to the first microlens, match with each other along a direction that is perpendicular to the first surface of the semiconductor substrate.

According to an exemplary embodiment of the inventive concept, there is provided an image sensor including a semiconductor substrate having a first region and a second region; an isolation region filling an isolation trench that partially penetrates the semiconductor substrate; plurality of photoelectric conversion regions defined by the isolation region and forming a first array on a plane that is parallel to a surface of the semiconductor substrate; and a plurality of microlenses respectively corresponding to the plurality of photoelectric conversion regions, and forming a second array on the plane that is parallel to the surface of the semiconductor substrate, wherein a center of each of a first photoelectric conversion region and a first microlens corresponding to the first photoelectric conversion region overlap each other in the first region, and a center of each of a second photoelectric conversion region and a second microlens corresponding to the second photoelectric conversion region do not overlap each other in the second region.

BRIEF DESCRIPTION OF THE DRAWINGS

The above and other features of the inventive concept will be more clearly understood by describing in detail exemplary embodiments thereof with reference to the accompanying drawings in which.

DETAILED DESCRIPTION OF THE EMBODIMENTS

Figure 1:
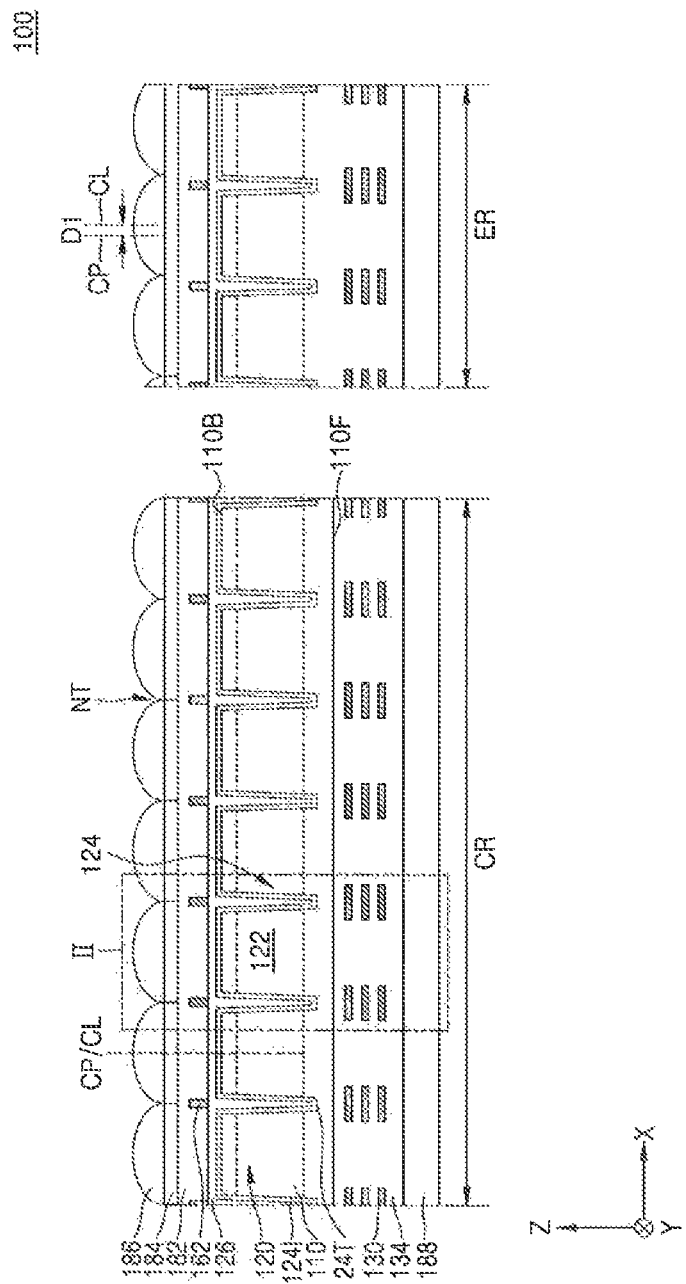
FIG. 1 is a cross-sectional view illustrating an image sensor, according to an exemplary embodiment of the inventive concept.
Figure 2:
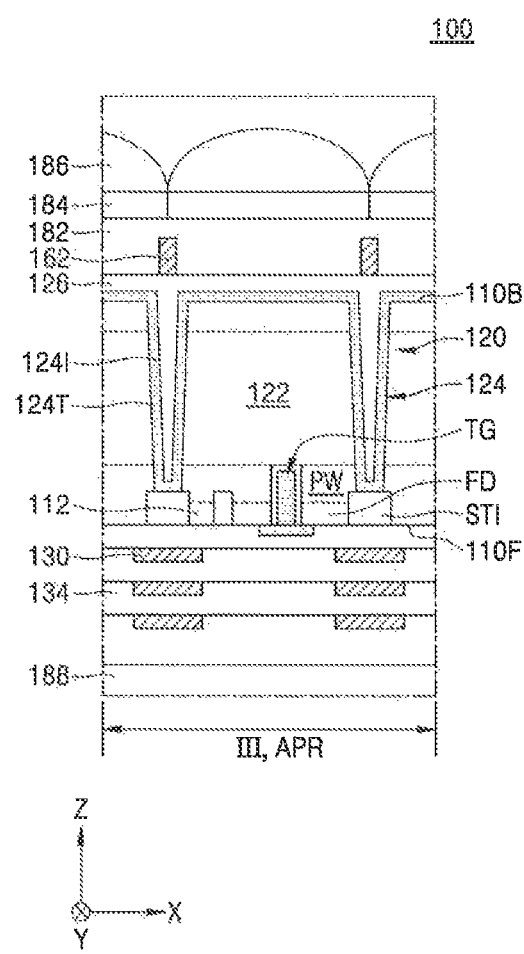
FIG. 2 is a magnified cross-sectional view illustrating the image sensor of FIG. 1 according to an exemplary embodiment of the inventive concept.

FIG. 1 is a cross-sectional view illustrating an image sensor 100 according to an exemplary embodiment of the inventive concept, and FIG. 2 is a magnified cross-sectional view illustrating a portion II of FIG. 1.

Referring to FIGS. 1 and 2, the image sensor 100 may include a semiconductor substrate 110 having a first region CR and a second region ER. The semiconductor substrate 110 may include a first surface 110F and a second surface 110B that are opposite to each other.

The semiconductor substrate 110 may be a bulk substrate, an epitaxial substrate, or a silicon on insulator (SOI) substrate. The semiconductor substrate 110 may include silicon (Si). Alternatively, the semiconductor substrate 110 may include a semiconductor element such as germanium (Ge), or a compound semiconductor such as silicon carbide (SiC), gallium arsenide (GaAs), indium arsenide (InAs), indium phosphide (InP) and the like. In exemplary embodiments of the inventive concept, the semiconductor substrate 110 may include a first conductive type semiconductor substrate. For example, the semiconductor substrate 110 may be a p-type semiconductor substrate. In exemplary embodiments of the inventive concept, the semiconductor substrate 110 may include a p-type bulk substrate and a p-type or n-type epitaxial layer grown thereon. In exemplary embodiments of the inventive concept, the semiconductor substrate 110 may include an n-type bulk substrate and a p-type or n-type epitaxial layer grown thereon. In exemplary embodiments of the inventive concept, the semiconductor substrate 110 may be an organic plastic substrate.

A plurality of photoelectric conversion regions 120 may be arranged in the semiconductor substrate 110. Each of the plurality of photoelectric conversion regions 120 may include a photodiode region 122 and a well region PW.

In exemplary embodiments of the inventive concept, the first region CR may include photoelectric conversion regions 120 that are arranged near a center region of the image sensor 100, and the second region ER may include photoelectric conversion regions 120 that are arranged near a side region of the image sensor 100.

The plurality of photoelectric conversion regions 120 may be arranged to have an arbitrary shape on the semiconductor substrate 110. For example, the plurality of photoelectric conversion regions 120 may be arranged in a zigzag along a first direction (e.g., an x-direction) that is parallel to the first surface 110F or the second surface 110B of the semiconductor substrate 110. In addition, the plurality of photoelectric conversion regions 120 may be arranged in columns in a second direction (e.g., a y-direction) that is perpendicular to the first direction (the x-direction). The plurality of photoelectric conversion regions 120 may form a hexagonal array on a plane (e.g., an X-Y plane) that is parallel to the first surface HOF and the second surface 110B of the semiconductor substrate 110.

Throughout the specification, the term "plane" may refer to the plane (e.g., the X-Y plane) that is parallel to the first surface 110F and the second surface 110B of the semiconductor substrate 110.

In exemplary embodiments of the inventive concept, a planar shape of each of the plurality of photoelectric conversion regions 120 may be generally rectangular. In exemplary embodiments of the inventive concept, the planar shape of each of the plurality of photoelectric conversion regions 120 may be generally hexagonal.

Throughout the specification, a planar shape may refer to a shape of an element on the plane, wherein the element has a generally-constant shape along a vertical direction (e.g., a z-direction).

Throughout the specification, when a shape is referred to as being generally rectangular or generally hexagonal, the shape may have not only a rectangular shape or a hexagonal shape but may also have shapes that are modified from the rectangular shape or the hexagonal shape, e.g., a rectangular shape having rounded corners, a hexagonal shape having rounded corners, or the like.

In exemplary embodiments of the inventive concept, the plurality of photoelectric conversion regions 120 may each have a generally-rectangular planar shape and may be arranged in a staggered array. In exemplary embodiments of the inventive concept, the plurality of photoelectric conversion regions 120 may each have a generally-hexagonal planar shape and may be arranged in a honeycomb array.

An isolation region 124 may be provided between adjacent photoelectric conversion regions 120. The isolation region. 124 may have a mesh shape on the plane. The isolation region 124 may be formed in an isolation trench 124T that partially penetrates through the semiconductor substrate 110. In exemplary embodiments of the inventive concept, the isolation trench 124T may partially penetrate through the semiconductor substrate 110 from the second surface 110B to the first surface 110F. The isolation region 124 may be provided between each of the plurality of photoelectric conversion regions 120, thereby forming the hexagonal array on the plane.

In exemplary embodiments of the inventive concept, the isolation region 124 may include a backside insulating layer 124I and a buried insulating layer 126. The backside insulating layer 124I is conformally formed on an inner wall of the isolation trench 124T and the buried insulating layer 126 is filled on the backside insulating layer 124I in the isolation trench 124T. In exemplary embodiments of the inventive concept, the backside insulating layer 124I may include a metal oxide such as hafnium oxide, aluminium oxide, tantalum oxide, or the like which may function as a negative fixed charge layer. However, the inventive concept is not limited thereto. In exemplary embodiments of the inventive concept, the backside insulating layer 124I may include an insulating material such as silicon oxide, silicon nitride, silicon oxynitride, or the like. The buried insulating layer 126 may include an insulating material such as silicon oxide, silicon nitride, silicon oxynitride, or the like.

The backside insulating layer 124I and the buried insulating layer 126 may extend from the inside of the isolation trench 124T over the second surface 110B of the semiconductor substrate 110. For example, the backside insulating layer 124I may conformally cover the inner wall of the isolation trench 124T and the second surface 110B of the semiconductor substrate 110. In addition, the buried insulating layer 126 may completely cover the second surface 110B of the semiconductor substrate 110 on the backside insulating layer 124I. A portion of the backside insulating layer 124I, which conformally covers the inner wall of the isolation trench 124T, may also be referred to as an insulating liner.

In exemplary embodiments of the inventive concept, the backside insulating layer 124I may have a thickness sufficient to fill the isolation trench 124T. In this case, the buried insulating layer 126 may not be formed in the isolation trench 124T, but may instead be formed to cover the backside insulating layer 124I on the second surface 110B of the semiconductor substrate 110.

A first inner wiring structure 130 may be provided on the first surface 110F of the semiconductor substrate 110. The first inner wiring structure 130 may be a stack structure of a plurality of layers. The first inner wiring structure 130 may include polysilicon that is doped with impurities, polysilicon that is not doped with impurities, metal, metal silicide, metal nitride, or a metal containing layer. For example, the first inner wiring structure 130 may include tungsten, aluminium, copper, tungsten silicide, titanium silicide, tungsten nitride, titanium nitride, doped polysilicon, or the like.

A first interlayer insulating layer 134 may be arranged to cover the first inner wiring structure 130 on the first surface 110F of the semiconductor substrate 110. The first interlayer insulating layer 134 may include an insulating material such as silicon oxide, silicon nitride, silicon oxynitride, or the like.

An isolation layer STI configured to define an active region 112 and a floating diffusion region FD may be provided on the first surface 110F of the semiconductor substrate 110. The isolation layer STI may be exposed via a bottom of the isolation trench 124T. In other words, the isolation region 124 that fills the isolation trench 124T may contact the isolation layer STI at the bottom of the isolation trench 124T. Gate electrodes of a plurality of transistors may be formed on the first surface 110F of the semiconductor substrate 110, and the first inner wiring structure 130 may be electrically connected to the gate electrodes or the active region 112. The gate electrodes may be covered with the first interlayer insulating layer 134.

For example, the plurality of transistors may include a transmission transistor TG configured to transmit charges generated in the photoelectric conversion region 120 to the floating diffusion region FD, a reset transistor configured to periodically reset the charges stored in the floating diffusion region FD, a drive transistor configured to function as a source follower buffer amplifier to buffer a signal according to the charges stored in the floating diffusion region FD, and a selecting transistor configured to perform switching and addressing operations for selecting the photoelectric conversion region 120. However, the inventive concept is not limited thereto.

A guide pattern 162 may be formed on the buried insulating layer 126. On the plane, the guide pattern 162 may have a mesh shape that is similar to that of the isolation region 124. The guide pattern 162 may prevent light from entering the photoelectric conversion region 120 adjacent thereto. The guide pattern 162 may include a metal material such as tungsten, aluminium, titanium, ruthenium, cobalt, nickel, copper, gold, silver or platinum.

A passivation layer 182 may be placed over the second surface 110B of the semiconductor substrate 110 to cover the buried insulating layer 126 and the guide pattern 162. A plurality of color filters 184 and a plurality of microlenses 186 may be placed on the passivation layer 182. A supporting substrate 188 may be placed over the first surface 110F of the semiconductor substrate 110.

The plurality of color filters 184 may include a red (R) filter, a blue (B) filter, and a green (G) filter. Alternatively, the plurality of color filters 184 may include a cyan (C) filter, a yellow (Y) filter, and a magenta (M) filter. One color filter 184 from among the R filter, the B filter, and the G filter or one color filter 184 from among the C filter, the Y filter, and the M filter may be placed on each photoelectric conversion region 120. In this case, each photoelectric conversion region 120 may recognize one color by sensing an isolated component of incident light.

Each of the plurality of microlenses 186 may focus incident light to each of the plurality of photoelectric conversion regions 120. The plurality of microlenses 186 may have an embossing structure, and a notch structure NT may be provided between boundaries of the plurality of microlenses 186.

The plurality of microlenses 186 may focus incident light to respective photodiode regions 122 of the plurality of microlenses 186. The plurality of microlenses 186 may include a TMR-based resin (a product of Tokyo Ohka Kogyo Co., Ltd.) or an MFR-based resin (a product of Japan Synthetic Rubber Corporation).

The plurality of microlenses 186 may be arranged over the semiconductor substrate 110 to have an arbitrary shape. For example, the plurality of microlenses 186 may be arranged in a zigzag in the first direction (e.g., the x-direction) that is parallel to the first surface 110F or the second surface 110B of the semiconductor substrate 110. In addition, the plurality of microlenses 186 may be arranged in columns in the second direction (e.g., the y-direction) that is perpendicular to the first direction (the x-direction). In exemplary embodiments of the inventive concept, a bottom surface of each of the plurality of microlenses 186 may have a generally-rectangular shape. In exemplary embodiments of the inventive concept, the bottom surface of each of the plurality of microlenses 186 may have a generally-hexagonal shape.

Each of the plurality of microlenses 186 may have a shape in which its bottom surface is rectangular or hexagonal and then a planar shape of each microlens 186 becomes rounded in an upward direction. For example, each of the plurality of microlenses 186 may have a hemisphere cross-section in the vertical direction (e.g., the z-direction).

In exemplary embodiments of the inventive concept, the plurality of microlenses 186 may form a hexagonal array on the plane. For example, the plurality of microlenses 186 may each have a generally-rectangular bottom surface and may be arranged in a staggered array. In exemplary embodiments of the inventive concept, the plurality of microlenses 186 may each have a generally-hexagonal bottom surface and may be arranged in a honeycomb array.

In exemplary embodiments of the inventive concept, the bottom surface of each of the plurality of microlenses 186 and the planar shape of each of the plurality of photoelectric conversion regions 120 may be generally the same. For example, the bottom surface of each of the plurality of microlenses 186 and the planar shape of each of the plurality of photoelectric conversion regions 120 may have a generally-rectangular shape. Alternatively, for example, the bottom surface of each of the plurality of microlenses 186 and the planar shape of each of the plurality of photoelectric conversion regions 120 may have a generally-hexagonal shape.

In exemplary embodiments of the inventive concept, the bottom surface of each of the plurality of microlenses 186 and the planar shape of each of the plurality of photoelectric conversion regions 120 may be different from each other. For example, the bottom surface of each of the plurality of microlenses 186 may have a generally-rectangular shape, and the planar shape of each of the plurality of photoelectric conversion regions 120 may have a generally-hexagonal shape. Alternatively, for example, the bottom surface of each of the plurality of microlenses 186 may have a generally-hexagonal shape, and the planar shape of each of the plurality of photoelectric conversion regions 120 may have a generally-rectangular shape.

In exemplary embodiments of the inventive concept, the plurality of color filters 184 may form a hexagonal array on the plane. For example, the plurality of color filters 184 may each have a generally-rectangular shape on the plane and may be arranged in a staggered array. In exemplary embodiments of the inventive concept, the plurality of color filters 184 may each have a generally-hexagonal shape on the plane and may be arranged in a honeycomb array.

Each of the plurality of color filters 184 may have substantially the same shape as at least one of each of the plurality of photoelectric conversion regions 120 and each of the plurality of microlenses 186. In exemplary embodiments of the inventive concept, when the bottom surface of each of the plurality of microlenses 186 and a planar shape of each of the plurality of photoelectric conversion regions 120 have about the same shape, each of the plurality of color filters 184 may have about the same shape as the plurality of microlenses 186 and the plurality of photoelectric conversion regions 120. In exemplary embodiments of the inventive concept, when the bottom surfaces of each of the plurality of microlenses 186 and a planar shape of each of the plurality of photoelectric conversion regions 120 have different shapes, each of the plurality of color filters 184 may have the same shape as one of each of the plurality of photoelectric conversion regions 120 and each of the plurality of microlenses 186 and may have a different shape than the other one.

In the first region CR, a first center CL and a second center CP which are respective centers, on the plane, of a microlens 186 and its corresponding photoelectric conversion region 120 may match with each other along the third direction (e.g., the z-direction) that is perpendicular to the first surface 110F or the second surface 110B of the semiconductor substrate 110.

In the second region ER, the first center CL and the second center CP which are respective centers, on the plane, of a microlens 186 and its corresponding photoelectric conversion region 120 may not match with each other along the third direction (e.g., the z-direction) that is perpendicular to the first surface 110F or the second surface 110B of the semiconductor substrate 110. Instead, the first center CL and the second center CP in the second region ER may be spaced apart from each other by a first distance D1 in a direction parallel to the first surface 110F or the second surface 110B of the semiconductor substrate 110.

Figure 3:
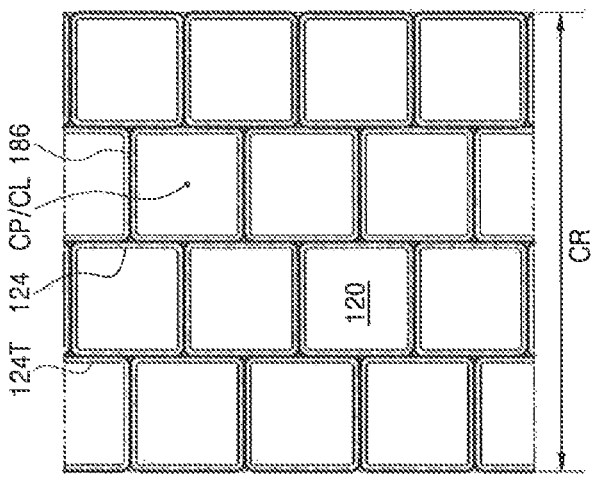
FIG. 3 is a planar array diagram illustrating certain elements of the image sensor of FIG. 1, according to an exemplary embodiment of the inventive concept.
Figure 3:
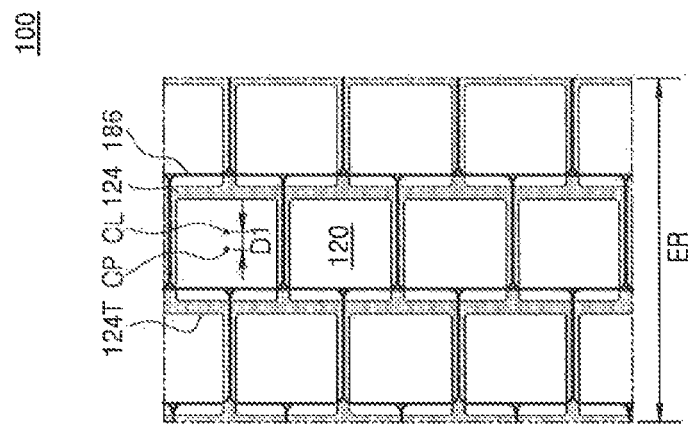

FIG. 3 is a planar array diagram illustrating certain elements of the image sensor 100, according to an exemplary embodiment of the inventive concept.

Referring to FIGS. 1 and 3, the image sensor 100 may have the first region CR and the second region ER. The image sensor 100 may include the plurality of photoelectric conversion regions 120 defined by the isolation region 124, and the plurality of microlenses 186 placed over the plurality of photoelectric conversion regions 120.

The plurality of photoelectric conversion regions 120 may be arranged to have an arbitrary shape on the semiconductor substrate 110. For example, the plurality of photoelectric conversion regions 120 may be arranged in a zigzag along the first direction (e.g., the x-direction) that is parallel to the first surface 110F or the second surface 110B of the semiconductor substrate 110. In addition, the plurality of photoelectric conversion regions 120 may be arranged in columns along the second direction (e.g., the y-direction) that is perpendicular to the first direction (e.g., the x-direction). In exemplary embodiments of the inventive concept, the planar shape of each of the plurality of photoelectric conversion regions 120 may be generally rectangular.

The plurality of photoelectric conversion regions 120 may form the hexagonal array on the plane. For example, the plurality of photoelectric conversion regions 120 may each have the generally-rectangular planar shape and may be arranged in a staggered array.

The plurality of microlenses 186 may be arranged over the semiconductor substrate 110 to have an arbitrary shape. For example, the plurality of microlenses 186 may be arranged in a zigzag along the first direction (e.g., the x-direction) that is parallel to the first surface 110F or the second surface 110B of the semiconductor substrate 110. In addition, the plurality of microlenses 186 may be arrayed in columns along the second direction (e.g., the y-direction) that is perpendicular to the first direction (e.g., the x-direction). Each of the plurality of microlenses 186 and each of the plurality of photoelectric conversion regions 120 may have substantially the same shape. In exemplary embodiments of the inventive concept, a bottom surface of each of the plurality of microlenses 186 may have a generally-rectangular shape.

The plurality of microlenses 186 may form a hexagonal array on the plane. For example, the plurality of microlenses 186 may each have the generally-rectangular bottom surface and may be arranged in a staggered array.

In the first region CR, the first center CL and the second center CP which are respective centers, on the plane, of a microlens 186 and its corresponding photoelectric conversion region 120 may match with each other along the third direction (e.g., the z-direction) that is perpendicular to the first surface 110I or the second surface 110B of the semiconductor substrate 110.

In the first region CR, the isolation region 124 and the boundaries of the plurality of microlenses 186 may overlap with each other along the third direction (e.g., the z-direction) that is perpendicular to the first surface 110F or the second surface 110B of the semiconductor substrate 110.

In the second region ER, the first center CL and the second center CP which are respective centers, on the plane, of a microlens 186 and its corresponding photoelectric conversion region 120 may not match with each other along the third direction (e.g., the z-direction) that is perpendicular to the first surface 110F or the second surface 110B of the semiconductor substrate 110. Rather, in the second region ER, the first center CL and the second center CP may be spaced apart from each other by the first distance D1 in the direction parallel to the first surface 110F or the second surface 110B of the semiconductor substrate 110.

In the second region ER, a portion of the isolation region 124 and a portion of the boundaries of the plurality of microlenses 186 may not overlap with each other along the third direction (e.g., the z-direction) that is perpendicular to the first surface 110F or the second surface 110B of the semiconductor substrate 110.

In the image sensor 100 according to an exemplary embodiment of the inventive concept, the isolation trench 124T, and the notch structure NT do not extend in a straight line along one direction (e.g., the x-direction) but may extend with curves. Therefore, it is possible to minimize propagation of cracks due to the isolation trench 124T, and thus, to prevent damage resulting from cracks. Therefore, the image sensor 100 has increased reliability.

In addition, in at least some regions (e.g., the second region ER) of the image sensor 100, a portion of the isolation trench 124T and a portion of the notch structure NT may not overlap with each other along the third direction (e.g., the z-direction) that is perpendicular to the first surface 110F or the second surface 110B of the semiconductor substrate 110. Accordingly, stress concentrated on the isolation trench 124T and the notch structure NT may be dispersed, and thus, damage to the image sensor 100 due to the stress may be prevented. Therefore, the image sensor 100 has further increased reliability.

Figure 4:
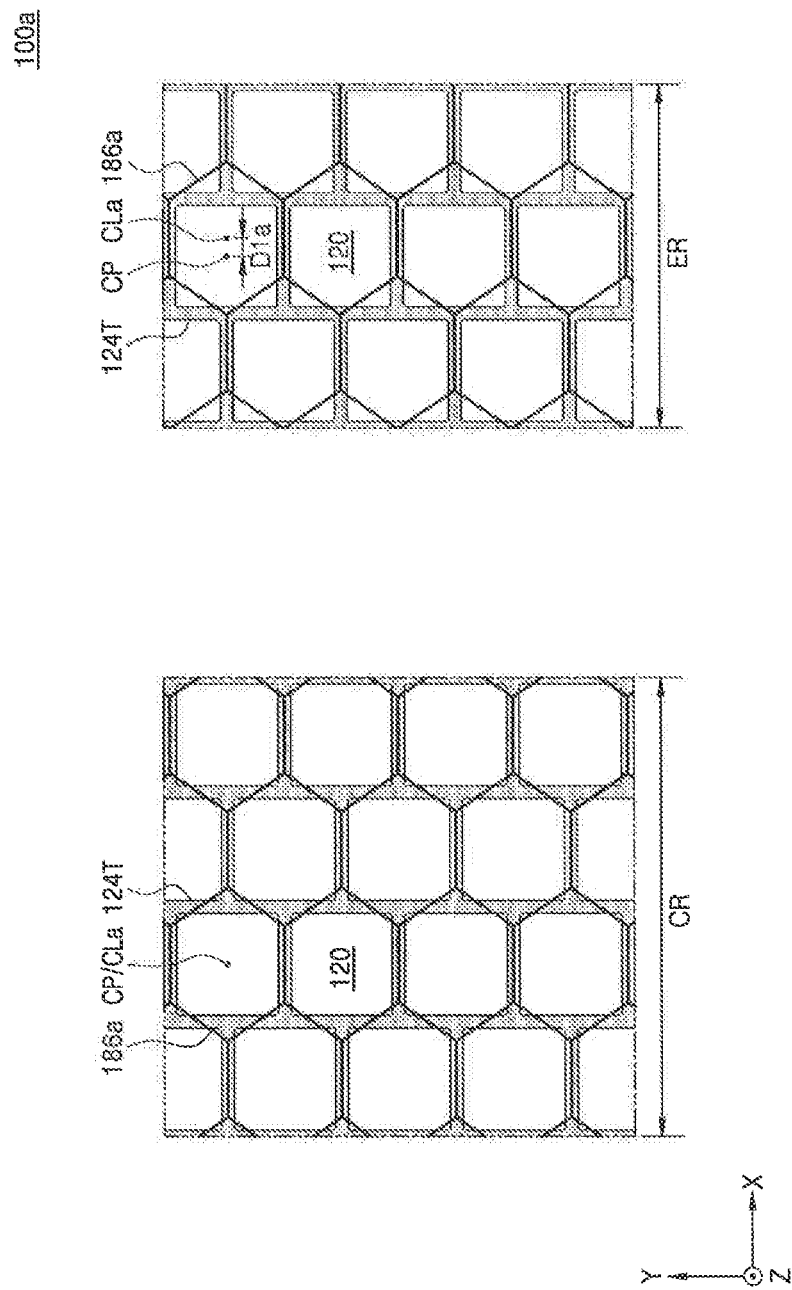
FIG. 4 is a planar array diagram illustrating certain elements of an image sensor, according to an exemplary embodiment of the inventive concept.

FIG. 4 is a planar array diagram illustrating certain elements of an image sensor 100a, according to an exemplary embodiment of the present inventive concept.

Referring to FIG. 4, the image sensor 100a may have a first region CR and a second region ER. The image sensor 100a includes the plurality of photoelectric conversion regions 120 defined by each isolation region 124, and a plurality of microlenses 186a placed over the plurality of photoelectric conversion regions 120.

The plurality of photoelectric conversion regions 120 may be arranged to have an arbitrary shape on the semiconductor substrate 110. For example, the plurality of photoelectric conversion regions 120 may be arranged in a zigzag along the first direction (e.g., the x-direction) that is parallel to the first surface 110F or the second surface 110B of a semiconductor substrate (e.g., the semiconductor substrate 110 of FIG. 1). In addition, the plurality of photoelectric conversion regions 120 may be arranged in columns along the second direction (e.g., the y-direction) that is perpendicular to the first direction (e.g., the x-direction). In exemplary embodiments of the inventive concept, a planar shape of each of the plurality of photoelectric conversion regions 120 may be generally rectangular.

The plurality of photoelectric conversion regions 120 may form a hexagonal array on the plane. For example, the plurality of photoelectric conversion regions 120 may each have a generally-rectangular planar shape and may be arranged in a staggered array.

The plurality of microlenses 186a may be arranged over the semiconductor substrate 110 to have an arbitrary shape. For example, the plurality of microlenses 186a may be arranged in a zigzag along the first direction (e.g., the x-direction) that is parallel to the first surface 110F or the second surface 110B of the semiconductor substrate 110 and may be arranged in a zigzag along the second direction (e.g., the y-direction) that is perpendicular to the first direction the x-direction). Each of the plurality of microlenses 186a and each of the plurality of photoelectric conversion regions 120 may have different shapes. In exemplary embodiments of the inventive concept, a bottom surface of each of the plurality of microlenses 186a may have a generally-hexagonal shape.

The plurality of microlenses 186a may form a hexagonal array on the plane. For example, the plurality of microlenses 186a may each have the generally-hexagonal bottom surface and may be arranged in a honeycomb array.

In the first region CR, a first center CLa and a second center CP which are respective centers, on the plane, of a microlens 186a and its corresponding photoelectric conversion region 120 may match with each other along the third direction (e.g., the z-direction) that is perpendicular to the first surface 110F or the second surface 110B of the semiconductor substrate 110.

In the second region ER, the first center CLa and the second center CP which are respective centers, on the plane, of a microlens 186a and its corresponding photoelectric conversion region 120 may not match with each other along the third direction (e.g., the z-direction) that is perpendicular to the first surface 110F or the second surface 110B of the semiconductor substrate 110. Rather, in the second region ER, the first center CLa and the second center CP may be spaced apart from each other by a first distance D1a in a direction parallel to the first surface 110F or the second surface 110B of the semiconductor substrate 110.

Because the bottom surfaces of the plurality of microlenses 186a and the plurality of photoelectric conversion regions 120 have different shapes, in both the first region CR and the second region ER, a portion of the isolation region 124 and a portion of the boundaries of the plurality of microlenses 186a may not overlap with each other along the third direction (e.g., the z-direction) that is perpendicular to the first surface 110F or the second surface 110B of the semiconductor substrate 110.

In the image sensor 100a according to an exemplary embodiment of the inventive concept, in both the first region CR and the second region ER, a portion of the isolation trench 124T and a portion of a notch structure NT may not overlap with each other along the third direction (e.g., the z-direction) that is perpendicular to a top surface of the semiconductor substrate 110. Accordingly, stress concentrated on the isolation trench 124T and the notch structure NT may be dispersed, and thus, damage to the image sensor 100a due to the stress may be prevented. Therefore, the image sensor 100a has increased reliability.

Figure 5:
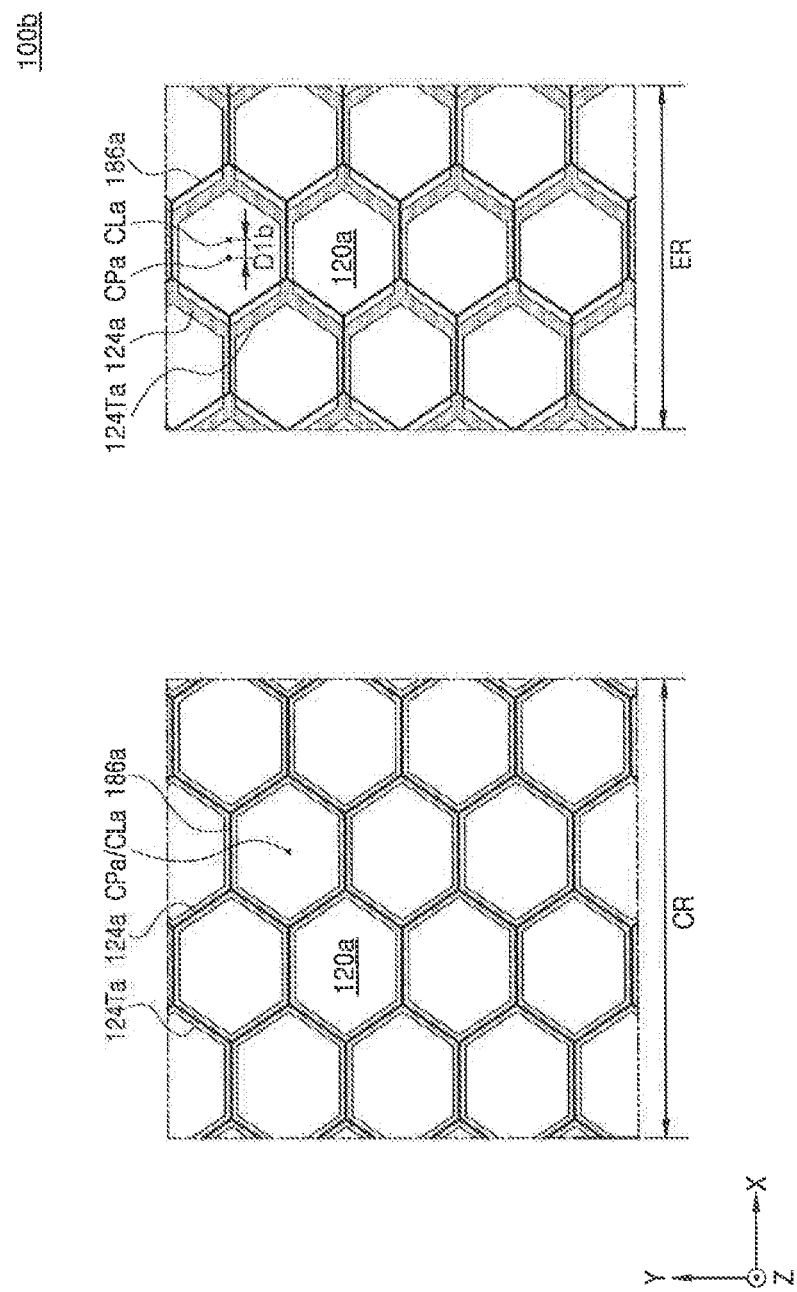
FIG. 5 is a planar array diagram illustrating certain elements of an image sensor, according to an exemplary embodiment of the inventive concept.

FIG. 5 is a planar array diagram illustrating certain elements of an image sensor 100b, according to an exemplary embodiment of the inventive concept. FIG. 5 illustrates a photoelectric conversion region 120a, an isolation region 124a, and an isolation trench 124Ta, for example.

Referring to FIG. 5, the image sensor 100b may have a first region CR and a second region ER. The image sensor 100b includes a plurality of the photoelectric conversion regions 120a defined by each isolation region 124a, and the plurality of microlenses 186a placed over the plurality of photoelectric conversion regions 120a.

The plurality of photoelectric conversion regions 120a may be arranged to have an arbitrary shape on the semiconductor substrate 110. For example, the plurality of photoelectric conversion regions 120a may be arranged in a zigzag along the first direction (e.g., the x-direction) that is parallel to the first surface 110F or the second surface 110B of a semiconductor substrate (e.g., the semiconductor substrate 110 of FIG. 1). In addition, the plurality of photoelectric conversion regions 120a may be arranged in a zigzag along the second direction (e.g., the y-direction) that is perpendicular to the first direction (e.g., the x-direction). In exemplary embodiments of the present inventive concept, a planar shape of each of the plurality of photoelectric conversion regions 120a may be generally hexagonal.

The plurality of photoelectric conversion regions 120a may form a hexagonal array on the plane. For example, a planar shape of each of the plurality of photoelectric conversion regions 120a may be generally hexagonal, and the plurality of photoelectric conversion regions 120a may be arranged in a honeycomb array.

The plurality of microlenses 186a may be arranged over the semiconductor substrate 110 to have an arbitrary shape. For example, the plurality of microlenses 186a may be arranged in a zigzag along the first direction (e.g., the x-direction) that is parallel to the first surface 110F or the second surface 110B of the semiconductor substrate 110 and may be arranged in a zigzag along the second direction (e.g., the y-direction) that is perpendicular to the first direction (e.g., the x-direction). A bottom surface of each of the plurality of microlenses 186a and each of the plurality of photoelectric conversion regions 120a may have substantially the same shape. In exemplary embodiments of the inventive concept, the bottom surface of each of the plurality of microlenses 186a may have a generally-hexagonal shape.

The plurality of microlenses 186a may form a hexagonal array on the plane. For example, the plurality of microlenses 186a may each have the generally-hexagonal bottom surface and may be arranged in a honeycomb array.

In the first region CR, a first center CLa and a second center CPa which are respective centers, on the plane, of a microlens 186a and its corresponding photoelectric conversion region 120a may match with each other along the third direction (e.g., the z-direction) that is perpendicular to the first surface 110F or the second surface 110B of the semiconductor substrate 110.

In the first region CR, the isolation region 124a and boundaries of the plurality of microlenses 186a may overlap with each other along the third direction (e.g., the z-direction) that is perpendicular to the first surface 110F or the second surface 110B of the semiconductor substrate 110.

In the second region ER, the first center CLa and the second center CPa which are respective centers, on the plane, of a microlens 186a and its corresponding photoelectric conversion region 120a may not match with each other along the third direction (e.g., the z-direction) that is perpendicular to the first surface 110F or the second surface 110B of the semiconductor substrate 110. Rather, in the second region ER, the first center CLa and the second center CPa may be spaced apart from each other by a first distance D1b in a direction parallel to the first surface 110F or the second surface 110B of the semiconductor substrate 110.

In the second region ER, a portion of the isolation region 124a and a portion of the boundaries of the plurality of microlenses 186a may not overlap with each other along the third direction (e.g., the z-direction) that is perpendicular to the first surface 110F or the second surface 110B of the semiconductor substrate 110.

Figure 6:
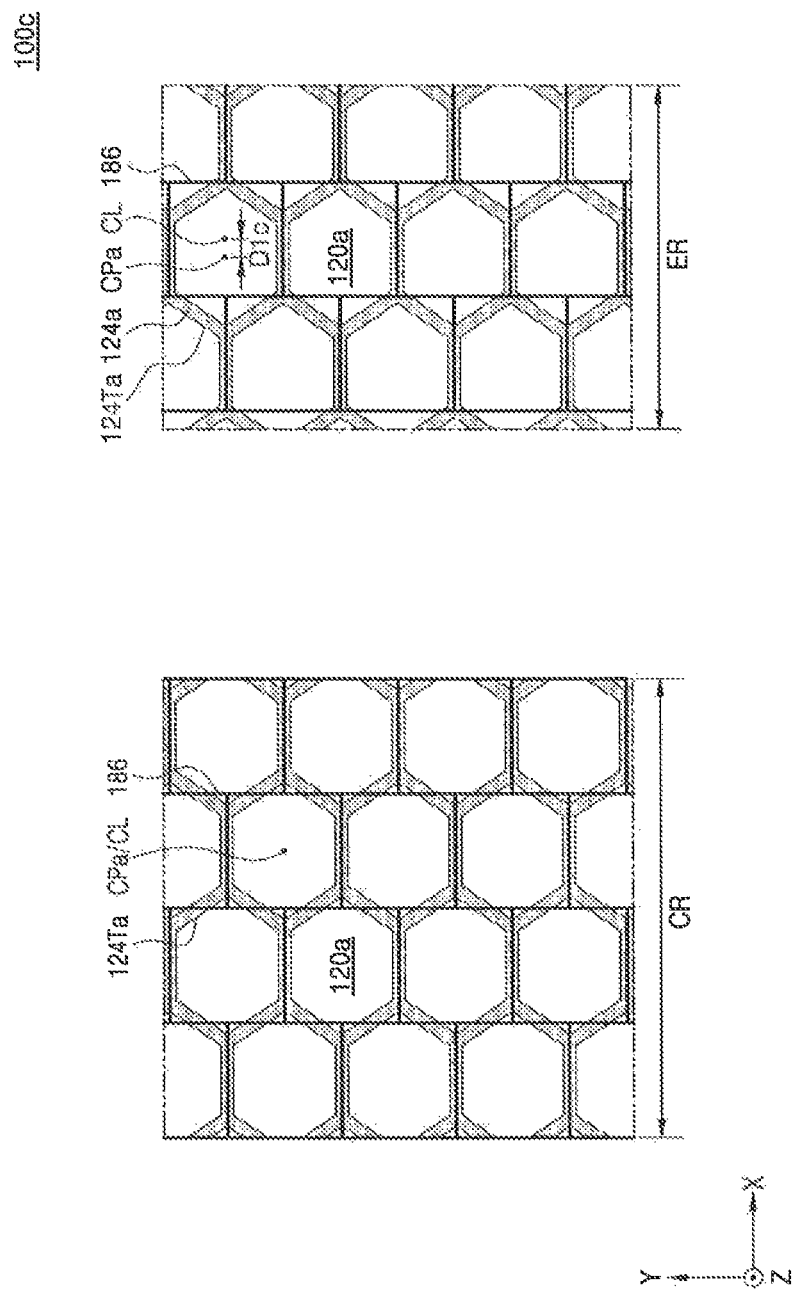
FIG. 6 is a planar array diagram illustrating certain elements of an image sensor, according to an exemplary embodiment of the inventive concept.

FIG. 6 is a planar array diagram illustrating certain elements of an image sensor 100c, according to an exemplary embodiment of the inventive concept. FIG. 6 illustrates the photoelectric conversion region 120a, the isolation region 124a, and the isolation trench 124Ta, for example.

Referring to FIG. 6, the image sensor 100c may have a first region CR and a second region ER. The image sensor 100c includes a plurality of the photoelectric conversion regions 120a defined by each isolation region 124a, and the plurality of microlenses 186 placed over the plurality of photoelectric conversion regions 120a.

The plurality of photoelectric conversion regions 120a may be arranged to have an arbitrary shape on the semiconductor substrate 110. For example, the plurality of photoelectric conversion regions 120a may be arranged in a zigzag along the first direction (e.g., the x-direction) that is parallel to the first surface 110F or the second surface 110B of a semiconductor substrate (e.g., the semiconductor substrate 110 of FIG. 1) and may be arranged in a zigzag along the second direction (the y-direction) that is perpendicular to the first direction (e.g., the x-direction). In exemplary embodiments of the inventive concept, a planar shape of each of the plurality of photoelectric conversion regions 120a may be generally hexagonal.

The plurality of photoelectric conversion regions 120a may form a hexagonal array on the plane. For example, a planar shape of the plurality of photoelectric conversion regions 120a may be generally hexagonal, and the plurality of photoelectric conversion regions 120a may be arranged in a honeycomb array.

The plurality of microlenses 186 may be arranged over the semiconductor substrate 110 to have an arbitrary shape. For example, the plurality of microlenses 186 may be arranged in a zigzag along the first direction (e.g., the x-direction) that is parallel to the first surface 110F or the second surface 110B of the semiconductor substrate 110. In addition, the plurality of microlenses 186 may be arranged in columns along the second direction (e.g., the y-direction) that is perpendicular to the first direction (e.g., the x-direction). A bottom surface of each of the plurality of microlenses 186 and each of the plurality of photoelectric conversion regions 120a may have substantially the same shape. In exemplary embodiments of the inventive concept, the bottom surface of each of the plurality of microlenses 186 may have a generally-rectangular shape.

The plurality of microlenses 186 may form a hexagonal array on the plane. For example, the plurality of microlenses 186 may each have a generally-rectangular bottom surface and may be arranged in a staggered array.

In the first region CR, a first center CL and a second center CPa which are respective centers, on the plane, of a microlens 186 and its corresponding photoelectric conversion region 120a may match with each other along the third direction (e.g., the z-direction) that is perpendicular to the first surface 110F or the second surface 110B of the semiconductor substrate 110.

In the second region ER, the first center CL and the second center CPa which are respective centers, on the plane, of a microlens 186 and its corresponding photoelectric conversion region 120a may not match with each other along the third direction (e.g., the z-direction) that is perpendicular to the first surface 110F or the second surface 110B of the semiconductor substrate 110. Rather, in the second region ER, the first center CL and the second center CPa may be spaced apart from each other by a first distance D1c in a direction parallel to the first surface 110F or the second surface 110B of the semiconductor substrate 110.

Because the bottom surfaces of the plurality of microlenses 186 and the plurality of photoelectric conversion regions 120a have different shapes, in both the first region CR and the second region ER, a portion of the isolation region 124a and a portion of boundaries of the plurality of microlenses 186 may not overlap with each other along the third direction (e.g., the z-direction) that is perpendicular to the first surface 110F or the second surface 110B of the semiconductor substrate 110.

Figure 7:
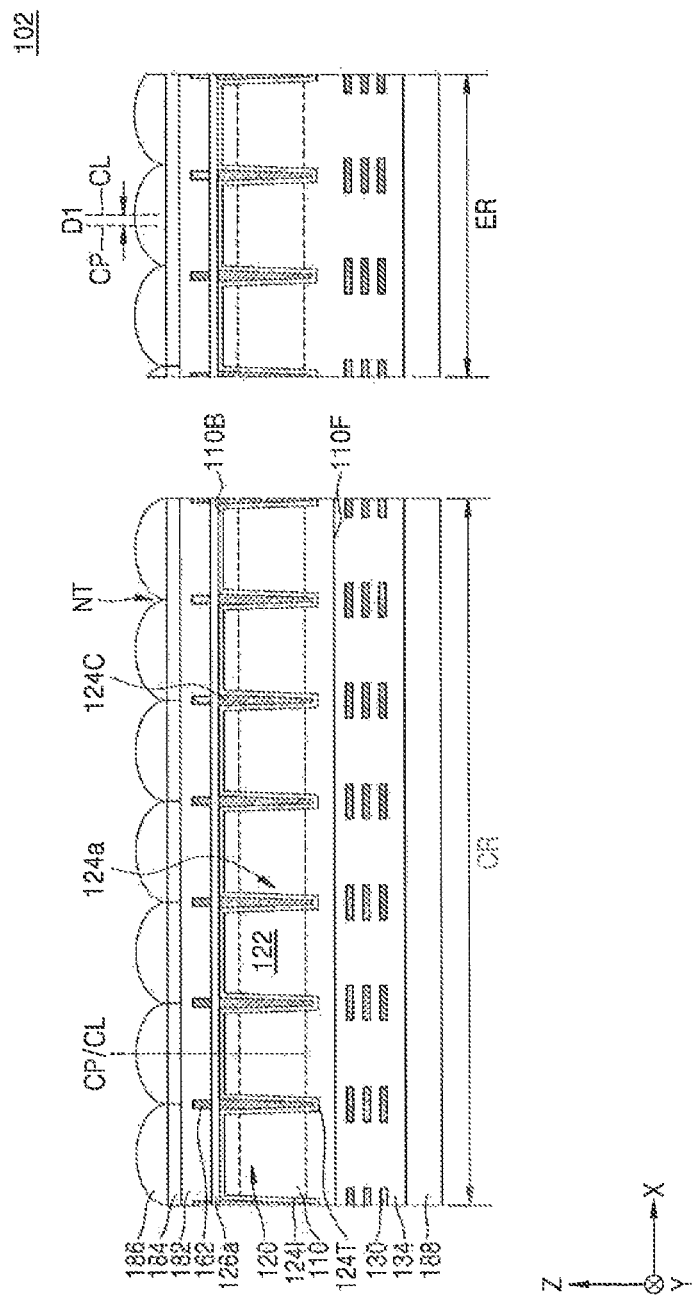
FIG. 7 is a cross-sectional view illustrating an image sensor according to an exemplary embodiment of the inventive concept.

FIG. 7 is a cross-sectional view illustrating an image sensor 102 according to an exemplary embodiment of the inventive concept. FIG. 7 illustrates the isolation region 124a, a conductive buried layer 124C, and a cover insulating layer 126a, for example.

Referring to FIG. 7, the image sensor 102 may have a first region CR and a second region ER. The image sensor 102 may include the plurality of photoelectric conversion regions 120. In exemplary embodiments of the inventive concept, the first region CR may include photoelectric conversion regions 120 that are arranged near a center region of the image sensor 102, and the second region ER may include photoelectric conversion regions 120 that are arranged near a side region of the image sensor 102.

The plurality of photoelectric conversion regions 120 may be arranged to have an arbitrary shape on the semiconductor substrate 110. The plurality of photoelectric conversion regions 120 may form a hexagonal array on the plane. In exemplary embodiments of the inventive concept, the plurality of photoelectric conversion regions 120 may each have the generally-rectangular planar shape and may be arranged in a staggered array. In exemplary embodiments of the inventive concept, like the plurality of photoelectric conversion regions 120a illustrated in FIGS. 5 and 6, the plurality of photoelectric conversion regions 120 may each have the generally-hexagonal planar shape and may be arranged in a honeycomb array.

The isolation region 124a may be provided between adjacent photoelectric conversion regions 120. The isolation region 124a may be provided between the plurality of photoelectric conversion regions 120 and may have a mesh shape on the plane. The isolation region 124a may be formed in the isolation trench 124T that partially penetrates through the semiconductor substrate 110. The isolation region 124a may be provided between the plurality of photoelectric conversion regions 120 forming the hexagonal array on the plane.

In exemplary embodiments of the inventive concept, the isolation region 124a may include the backside insulating layer 124I and the conductive buried layer 124C, wherein the backside insulating layer 124I conformally covers an inner wall of the isolation trench 124T and the conductive buried layer 124C is filled on the backside insulating layer 124I in the isolation trench 124T. In exemplary embodiments of the inventive concept, the conductive buried layer 124C may include a conductive material. For example, the conductive buried layer 124C may include polysilicon, or polysilicon doped with impurities. However, a material of the conductive buried layer 124C is not limited to the aforementioned materials. The conductive buried layer 124C may include at least one of all conductive materials that may be gap-filled on the backside insulating layer 124I in the isolation trench 124T. For example, the conductive buried layer 124C may include metal, metal silicide, and a metal containing a conductive material.

The backside insulating layer 124I may extend from the inside of the isolation trench 124T over the second surface 110B of the semiconductor substrate 110. For example, the backside insulating layer 124I may be conformally formed on the inner wall of the isolation trench 124T and the second surface 110B of the semiconductor substrate 110. A portion of the backside insulating layer 124I, which conformally covers the inner wall of the isolation trench 124T, may also be referred to as an insulating liner.

In exemplary embodiments of the inventive concept, the conductive buried layer 124C may include a conductive material capable of reflecting light. Therefore, light that is incident on a first photoelectric conversion region 120 surrounded by the conductive buried layer 124C may be reflected by the conductive buried layer 124C. As a result, such light may not propagate to a second photoelectric conversion region 120 adjacent to the first photoelectric conversion 120, but instead, may be absorbed by the first photoelectric conversion region 120. Therefore, the light-focusing performance of each of the plurality of photoelectric conversion regions 120 included in the image sensor 102 may be increased and the photo sensing efficiency of the image sensor 102 may be increased.

In exemplary embodiments of the inventive concept, the conductive buried layer 124C may have an electrically-single body structure. Ground voltage or negative voltage is applied to the conductive buried layer 124C, and the occurrence of an electrostatic discharge (ESD) bruise defect in the image sensor 102 may be prevented. The ESD bruise defect may refer to a defect in which a stain such as a bruise is generated on an image because charges generated due to ESD are stored in the image sensor 102.

The backside insulating layer 124I may extend from the inside of the isolation trench 124T over the second surface 110B of the semiconductor substrate 110. For example, the backside insulating layer 124I may conformally cover the inner wall of the isolation trench 124T and the second surface 110B of the semiconductor substrate 110. The cover insulating layer 126a completely covers the second surface 110B of the semiconductor substrate 110 on the backside insulating layer 124I and the conductive buried layer 124C.

The guide pattern 162 may be formed on the cover insulating layer 126a. The passivation layer 182 may be placed over the second surface 110B of the semiconductor substrate 110 to cover the cover insulating layer 126a and the guide pattern 162, and the plurality of color filters 184 and the plurality of microlenses 186 may be placed on the passivation layer 182. The supporting substrate 188 may be placed over the first surface 110F of the semiconductor substrate 110.

The plurality of microlenses 186 may be arranged over the semiconductor substrate 110 to have an arbitrary shape. For example, the plurality of microlenses 186 may be arranged in a zigzag along the first direction (e.g., the x-direction) that is parallel to the first surface 110F or the second surface 110O of the semiconductor substrate 110. In addition, the plurality of microlenses 186 may be arrayed in columns along the second direction (e.g., the y-direction) that is perpendicular to the first direction (e.g., the x-direction). The bottom surfaces of the plurality of microlenses 186 may form a hexagonal array.

In exemplary embodiments of the inventive concept, the bottom surface of each of the plurality of microlenses 186 may have a generally-rectangular shape. In exemplary embodiments of the inventive concept, the bottom surface of each of the plurality of microlenses 186 may have a generally-hexagonal shape like that of the plurality of microlenses 186a illustrated in FIGS. 4 and 5.

For example, the plurality of microlenses 186 may each have the generally-rectangular bottom surface and may be arranged in a staggered array. In exemplary embodiments of the inventive concept, the plurality of microlenses 186 may each have the generally-hexagonal bottom surface and may be arranged in a honeycomb array.

Figure 8:
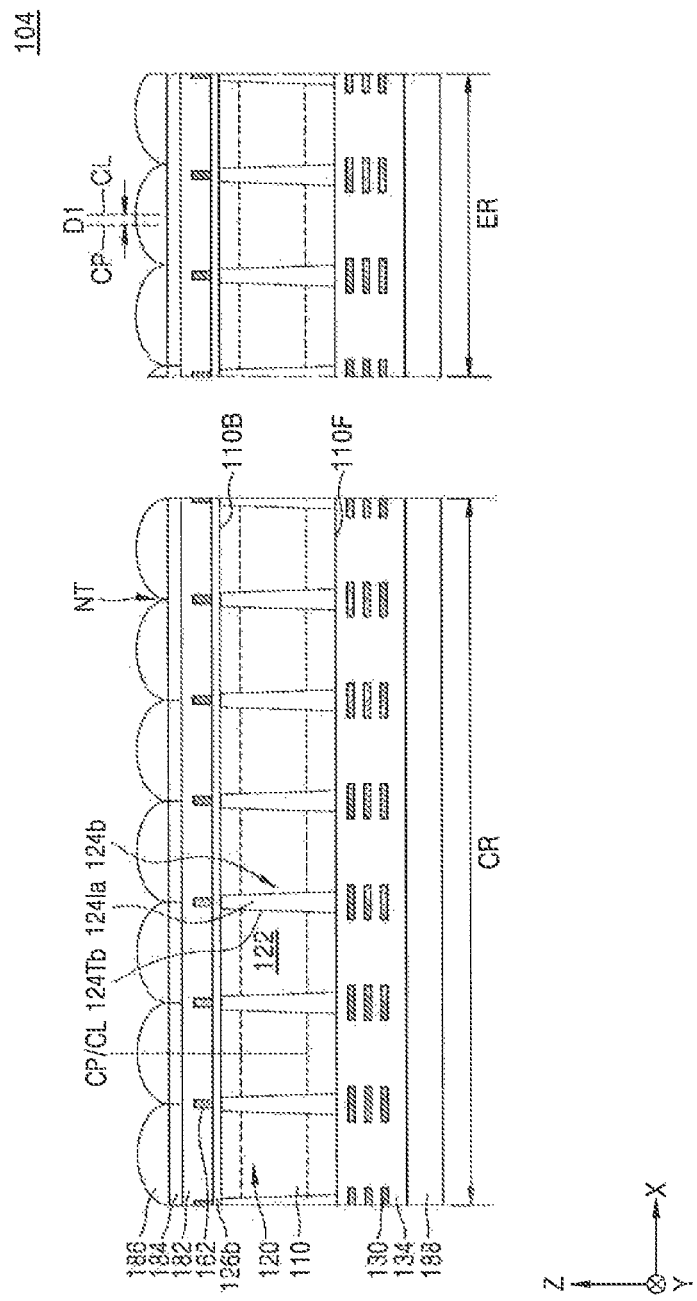
FIG. 8 is a cross-sectional view illustrating an image sensor according to an exemplary embodiment of the inventive concept.

FIG. 8 is a cross-sectional view illustrating an image sensor 104 according to an exemplary embodiment of the inventive concept. FIG. 8 illustrates an isolation region 124b, an isolation insulating layer 124Ia, an isolation trench 124Tb, and a cover insulating layer 126b, for example.

Referring to FIG. 8, in the image sensor 104, the isolation region 124b may completely penetrate through the semiconductor substrate 110 from the first surface 110F of the semiconductor substrate 110 to the second surface 110B. The isolation trench 124Tb may completely penetrate through the semiconductor substrate 110 from the first surface 110F to the second surface 110B. The isolation region 124b may include the isolation insulating layer 124Ia that fills the isolation trench 124Tb. The cover insulating layer 126b may not be formed in the isolation trench 124Tb and may be formed on the entirety of the second surface 110B of the semiconductor substrate 110.

In exemplary embodiments of the inventive concept, the isolation insulating layer 124Ia may include an insulating material such as silicon oxide, silicon nitride, silicon oxynitride, or the like. In exemplary embodiments of the inventive concept, an insulating liner may conformally cover an inner wall of the isolation trench 124Tb, and the isolation insulating layer 124Ia may be filled on the insulating liner in the isolation trench 124Tb.

Figure 9:
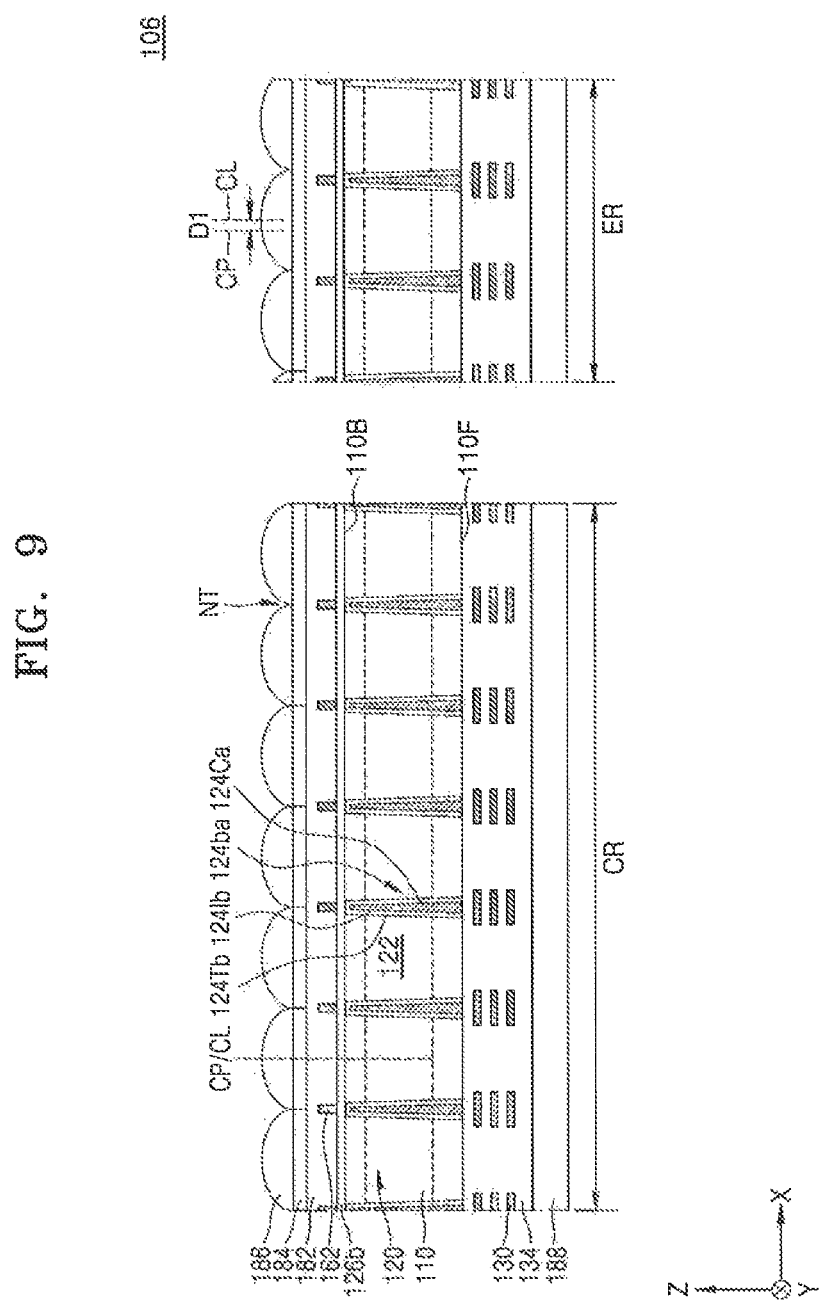
FIG. 9 is a cross-sectional view illustrating an image sensor according to an exemplary embodiment of the inventive concept.

FIG. 9 is a cross-sectional view illustrating an image sensor 106 according to an exemplary embodiment of the inventive concept FIG. 9 illustrates an isolation region 124ba, an insulating liner 124Ib, and a conductive buried layer 124Ca, for example.

Referring to FIG. 9, in the image sensor 106, the isolation region 124ba may include the insulating liner 124Ib and the conductive buried layer 124Ca, wherein the insulating liner 124Ib conformally covers an inner wall of the isolation trench 124Tb, and the conductive buried layer 124Ca is filled on the insulating liner 124Ib in the isolation trench 124Tb.

In exemplary embodiments of the inventive concept, the conductive buried layer 124Ca may include a conductive material capable of reflecting light. In exemplary embodiments of the inventive concept, the conductive buried layer 124Ca may have an electrically-single body structure.

Figure 10:
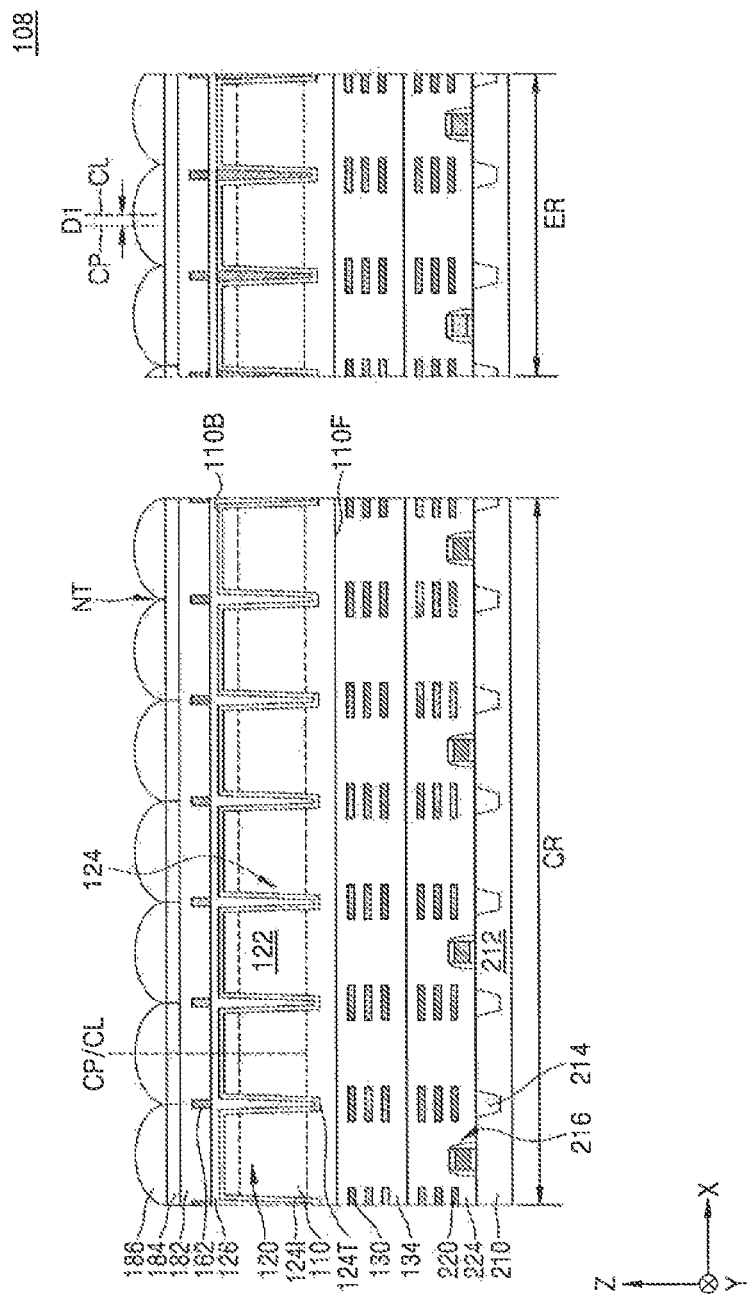
FIG. 10 a cross-sectional view illustrating an image sensor according to an exemplary embodiment of the inventive concept.

FIG. 10 a cross-sectional view illustrating an image sensor 108 according to an exemplary embodiment of the inventive concept.

Referring to FIG. 10, the image sensor 108 may have a stack structure where the semiconductor substrate 110 and a lower substrate 210 are bonded to each other with elements interposed therebetween. In the image sensor 108, elements other than the lower substrate 210, a gate structure 216, a second inner wiring structure 220, and a second interlayer insulating layer 224 are generally the same as those of the image sensor 100 of FIG. 1 except for the supporting substrate 188, therefore, detailed descriptions thereof are not provided here.

Bottom active regions 212 defined by isolation layers 214 may be arranged in the lower substrate 210. The gate structure 216 may be arranged on the lower substrate 210. The gate structure 216 may provide a constant signal to each of the plurality of photoelectric conversion regions 120, or may configure a plurality of complementary metal-oxide-semiconductor (CMOS) transistors to control respective output signals from the plurality of photoelectric conversion regions 120. For example, the CMOS transistors may configure various types of logic circuits including a timing generator, a row decoder, a row driver, a correlated double sampler (CDS), an analog-to-digital converter (ADC), a latch, a column decoder, or the like, and the inventive concept is not limited thereto.

The second inner wiring structure 220 may be provided over the lower substrate 210. The second inner wiring structure 220 may have a stack structure of a plurality of layers. The second interlayer insulating layer 224 may be provided on the lower substrate 210 to cover the gate structure 216 and the second inner wiring structure 220.

The first interlayer insulating layer 134 may be bonded to the second interlayer insulating layer 224. In exemplary embodiments of the inventive concept, the first interlayer insulating layer 134 may be bonded to the second interlayer insulating layer 224 by using an oxide-oxide direct bonding method. In exemplary embodiments of the inventive concept, an adhesive member may be provided between the first interlayer insulating layer 134 and the second interlayer insulating layer 224.

FIGS. 11 to 15 are cross-sectional views illustrating a procedure of manufacturing an image sensor, according to an exemplary embodiment of the inventive concept. For example, FIGS. 11 to 15 are cross-sectional views illustrating an order of processes used to manufacture the image sensor 100 of FIGS. 1 to 3. A method of manufacturing the image sensors 100a, 100b, and 100c of FIGS. 4 to 6 will also be described.

Figure 11:
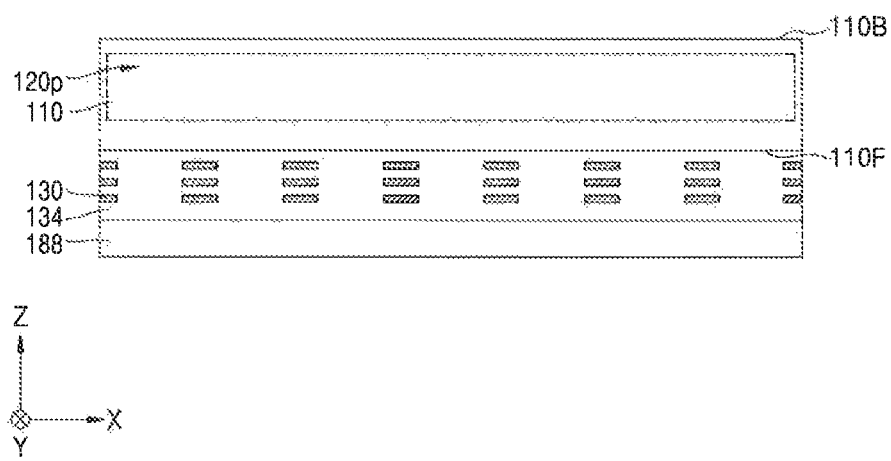
FIGS. 11, 12, 13, 14 and 15 are cross-sectional views illustrating a procedure of manufacturing an image sensor, according to an exemplary embodiment of the inventive concept.

Referring to FIG. 11, the semiconductor substrate 110 having the first surface 110F and the second surface 110B, which face opposite directions, is prepared.

A preliminary photoelectric conversion region 120p and a well region (refer, e.g., to the well region PW of FIG. 2) may be formed from the first surface 110F of the semiconductor substrate 110 via an ion implantation process. For example, the preliminary photoelectric conversion region 120p may be formed by doping the first surface 110F with n-type impurities, and the well region may be formed by doping the first surface 110F with p-type impurities.

Afterward, the first inner wiring structure 130 and the first interlayer insulating layer 134 covering the first inner wiring structure 130 may be formed on the first surface 110F of the semiconductor substrate 110. For example, the first inner wiring structure 130 and the first interlayer insulating layer 134 may be formed by forming a conductive layer on the first surface 110F of the semiconductor substrate 110, patterning the conductive layer, and forming an insulating layer to cover the patterned conductive layer.

Afterward, the supporting substrate 188 may be bonded onto the first interlayer insulating layer 134 on the first surface 110F of the semiconductor substrate 110.

Figure 12:
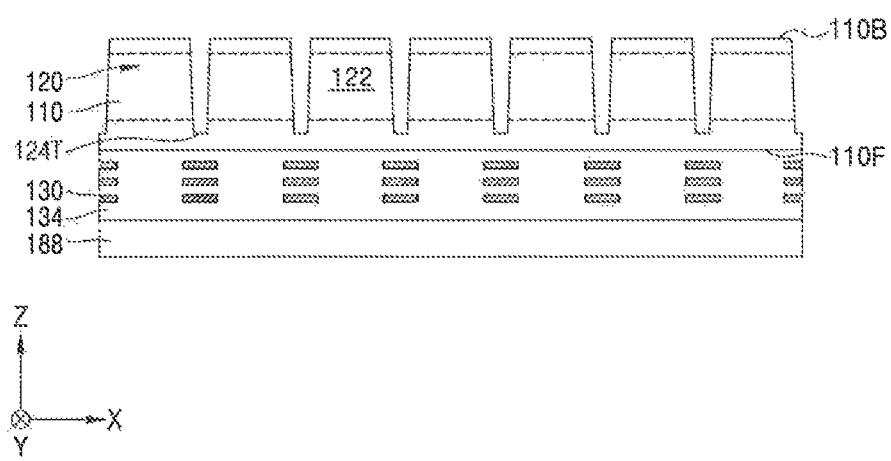

Referring to FIG. 12, a first mask pattern may be formed on the second surface 110B of the semiconductor substrate 110, and the isolation trenches 124T may be formed by etching the semiconductor substrate 110 from the second surface 110B by using the first mask pattern as an etching mask. Due to the isolation trenches 124T, the preliminary photoelectric conversion region 120p may be divided into the plurality of photoelectric conversion regions 120. Each of the plurality of photoelectric conversion regions 120 may include the photodiode region 122.

The isolation trenches 124T may have a mesh shape on the plane. The isolation trenches 124T may be placed to allow the plurality of photoelectric conversion regions 120 to form a hexagonal array on the plane. In exemplary embodiments of the inventive concept, the plurality of photoelectric conversion regions 120 may each have a generally-rectangular planar shape and may be arranged in a staggered array. In exemplary embodiments of the inventive concept, the plurality of photoelectric conversion regions 120 may each have a generally-hexagonal planar shape and may be arranged in a honeycomb array.

In exemplary embodiments of the inventive concept, the isolation trench 124T may not completely penetrate through the semiconductor substrate 110 such that a bottom of the isolation trench 124T may expose the semiconductor substrate 110.

In exemplary embodiments of the inventive concept, when the isolation trench 124T does not completely penetrate through the semiconductor substrate 110, an ion implantation process may be selectively performed on a portion of the semiconductor substrate 110 exposed via the bottom of the isolation trench 124T, such that an impurity region may be further formed on the exposed portion of the semiconductor substrate 110.

Figure 13:
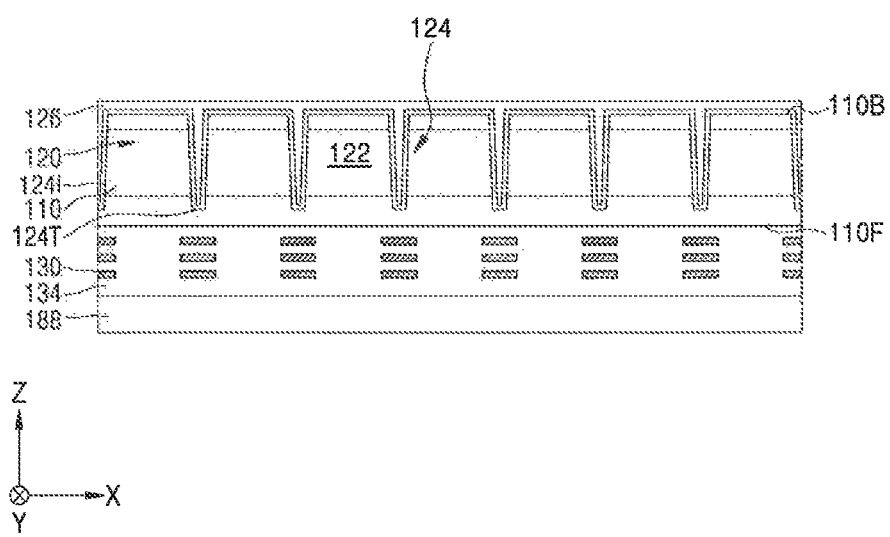

Referring to FIG. 13, the backside insulating layer 124I is formed on the second surface 110B of the semiconductor substrate 110 and the inner wall of the isolation trench 124T by using an insulating material via a chemical vapor deposition (CVD) process, an atomic layer deposition (ALD) process.

Afterward, the buried insulating layer 126 may be formed to fill the isolation trench 124T in the second surface 110B of the semiconductor substrate 110. The buried insulating layer 126 having a predetermined thickness may also be formed on the second surface 110B of the semiconductor substrate 110.

In exemplary embodiments of the inventive concept, the backside insulating layer 124I may be formed to completely fill the isolation trench 124T, and then the buried insulating layer 126 may be formed on the backside insulating layer 124I.

Figure 14:
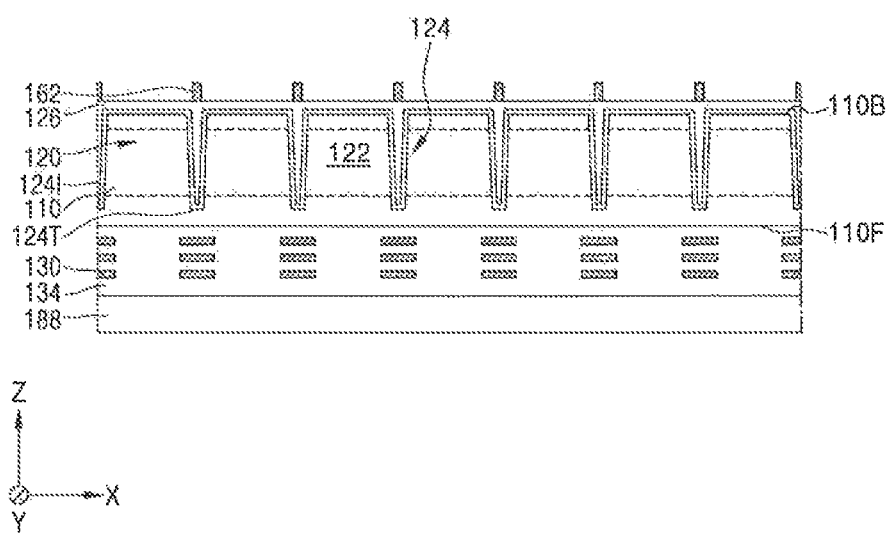

Referring to FIG. 14, a metal layer may be formed on the buried insulating layer 126. The metal layer may be formed by using a metal material such as titanium, titanium nitride, tantalum, tantalum nitride, titanium tungsten, tungsten, aluminium, cobalt, nickel, copper, or the like via a CVD process, an ALD process, and/or a plating process. Afterward, a second mask pattern may be formed, and then, the guide pattern 162 may be formed by patterning the metal layer by using the second mask pattern as an etching mask.

Figure 15:
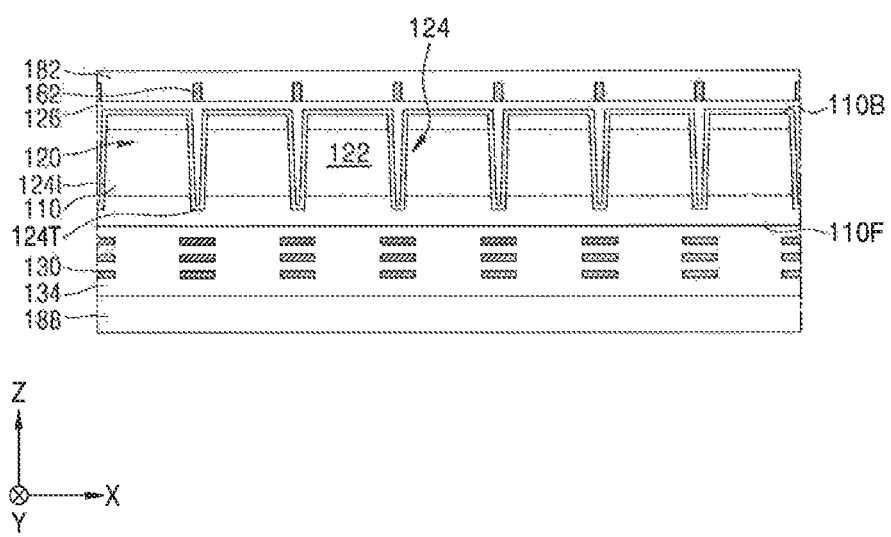

Referring to FIG. 15, the passivation layer 182 is formed over the second surface 110B of the semiconductor substrate 110 and covers the guide pattern 162.

Afterward, referring back to FIG. 1, the plurality of color filters 184 and the plurality of microlenses 186 may be formed on the passivation layer 182.

The plurality of microlenses 186 may be arranged to have an arbitrary shape over the semiconductor substrate 110. For example, the plurality of microlenses 186 may be arranged in a zigzag along the first direction (e.g., the x-direction) that is parallel to the first surface 110F or the second surface 110B of the semiconductor substrate 110. In addition, the plurality of microlenses 186 may be arranged in columns along the second direction (e.g., the y-direction) that is perpendicular to the first direction (e.g., the x-direction). In exemplary embodiments of the inventive concept, the bottom surface of each of the plurality of microlenses 186 may have the generally-rectangular shape. In exemplary embodiments of the inventive concept, the bottom surface of each of the plurality of microlenses 186 may have the generally-hexagonal shape.

In exemplary embodiments of the inventive concept, the plurality of microlenses 186 may form a hexagonal array on the plane. For example, the plurality of microlenses 186 may each have the generally-rectangular bottom surface and may be arranged in a staggered array. In exemplary embodiments of the inventive concept, the plurality of microlenses 186 may each have the generally-hexagonal bottom surface and may be arranged in a honeycomb array.

In exemplary embodiments of the inventive concept, the plurality of color filters 184 may form a hexagonal array on the plane. For example, the plurality of color filters 184 may each have a generally-rectangular shape on the plane and may be arranged in a staggered array. In exemplary embodiments of the inventive concept, the plurality of color filters 184 may each have a generally-hexagonal shape on the plane and may be arranged in a honeycomb array.

Each of the plurality of color filters 184 may have substantially the same shape as at least one of each of the plurality of photoelectric conversion regions 120 and a bottom surface of each of the plurality of microlenses 186. In exemplary embodiments of the inventive concept, when the bottom surface of each of the plurality of microlenses 186 and each of the plurality of photoelectric conversion regions 120 have about the same shape, each of the plurality of color filters 184 may have about the same shape as the bottom surface of each of the plurality of microlenses 186 and each of the plurality of photoelectric conversion regions 120. In exemplary embodiments of the inventive concept, when the bottom surface of each of the plurality of microlenses 186 and each of the plurality of photoelectric conversion regions 120 have different shapes, each of the plurality of color filters 184 may have the same shape as one of the bottom surface of each of the plurality of microlenses 186 and each of the plurality of photoelectric conversion regions 120 and may have a different shape than the other one.

In exemplary embodiments of the inventive concept, the bottom surfaces of each of the plurality of microlenses 186 and each of the plurality of photoelectric conversion regions 120 have substantially the same shape. For example, the bottom surface of each of the plurality of microlenses 186 and each of the plurality of photoelectric conversion regions 120 may have a generally-rectangular shape on the plane. Alternatively, for example, the bottom surface of each of the plurality of microlenses 186 and each of the plurality of photoelectric conversion regions 120 may have a generally-hexagonal shape on the plane.

In exemplary embodiments of the inventive concept, the bottom surface of each of the plurality of microlenses 186 and each of the plurality of photoelectric conversion regions 120 may have different shapes. For example, the bottom surface of each of the plurality of microlenses 186 may have a generally-rectangular shape, and each of the plurality of photoelectric conversion regions 120 may have a generally-hexagonal shape on the plane. Alternatively, for example, the bottom surface of each of the plurality of microlenses 186 may have a generally-hexagonal shape, and each of the plurality of photoelectric conversion regions 120 may have a generally-rectangular shape on the plane.

In the first region CR, the first center CL and the second center CP which are respective centers, on the plane, of a microlens 186 and its corresponding photoelectric conversion region 120 may match with each other along the third direction (e.g., the z-direction) that is perpendicular to the first surface 110F or the second surface 110B of the semiconductor substrate 110.

In the second region ER, the first center CL and the second center CP which are respective centers, on the plane, of a microlens 186 and its corresponding photoelectric conversion region 120 may not match with each other along the third direction (e.g., the z-direction) that is perpendicular to the first surface 110F or the second surface 110B of the semiconductor substrate 110. Rather, the second region ER, the first center CL and the second center CP may be spaced apart from each other by the first distance D1 in a direction parallel to the first surface 110F or the second surface 110B of the semiconductor substrate 110.

Figure 16:
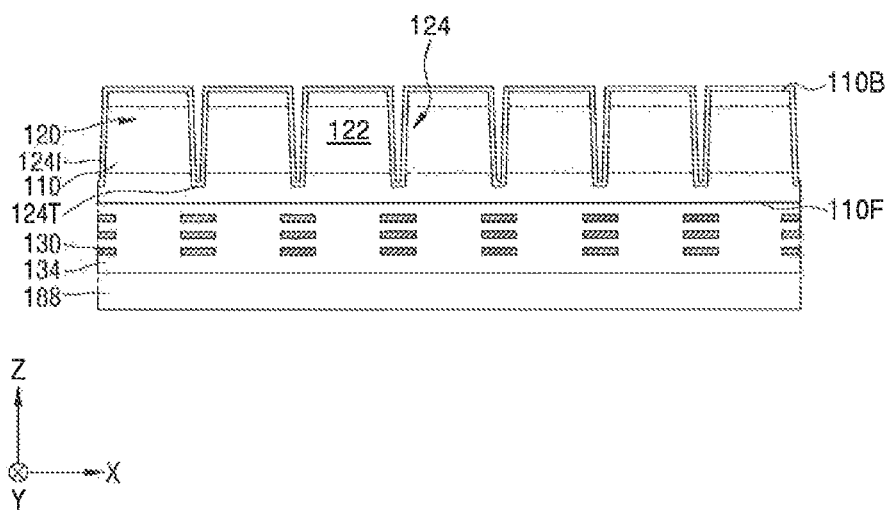
FIGS. 16 and 17 are cross-sectional views illustrating a process of manufacturing an image sensor, according to an exemplary embodiment of the inventive concept.
Figure 17:
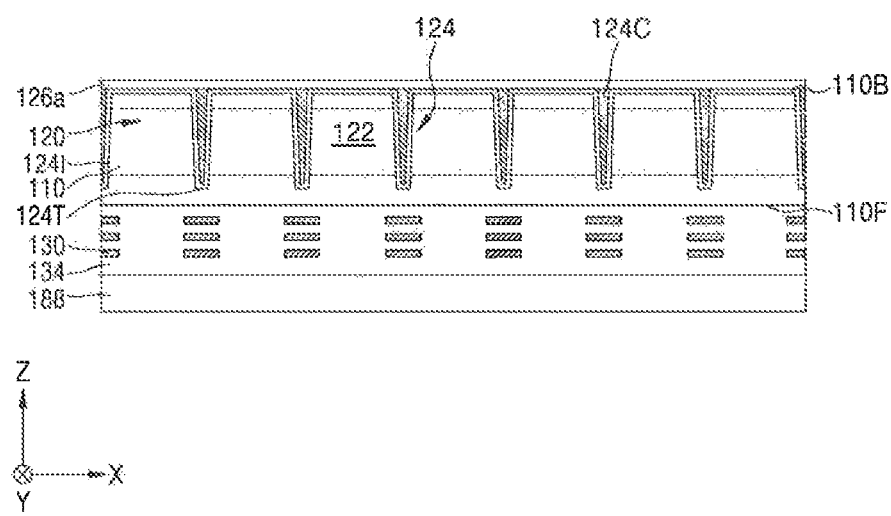

FIGS. 16 and 17 are cross-sectional views illustrating a process of manufacturing an image sensor, according to an exemplary embodiment of the inventive concept. For example, FIGS. 16 and 17 are cross-sectional views illustrating an order of manufacturing the image sensor 102 of FIG. 7, the processes being performed after a process of FIG. 12.

Referring to FIG. 16, the backside insulating layer 124I is conformally formed on the inner wall of the isolation trench 124T by using an insulating material via a CVD process, an ALD process, or the like with respect to the second surface 110B of the semiconductor substrate 110 and the inner wall of the isolation trench 124T. The backside insulating layer 124I may not completely fill the isolation trench 124T.

Referring to FIG. 17, the conductive buried layer 124C that completely fills the isolation trench 124T is formed. The conductive buried layer 124C may be formed filling the isolation trench 124T and covering a top surface of the backside insulating layer 124I with a preliminary conductive layer, and then, removing a portion of the preliminary conductive buried layer to expose the backside insulating layer 124I on the second surface 110B of the semiconductor substrate 110.

Afterward, the cover insulating layer 126a that covers the backside insulating layer 124I and the conductive buried layer 124C is formed. The cover insulating layer 126a may be formed to completely cover the second surface 110B of the semiconductor substrate 110 on the backside insulating layer 124I and the conductive buried layer 124C.

Afterward, the image sensor 102 illustrated in FIG. 7 may be formed by performing a process similar to that described with reference to FIGS. 14 and 15.

A method of forming the image sensor 104 illustrated in FIG. 8 will now be described. The semiconductor substrate 110 having the first surface 110F and the second surface 110B, which face opposite directions, is prepared, and the cover insulating layer 126b is formed on the second surface 110B of the semiconductor substrate 110. Afterward, the isolation trench 124Tb for exposing the cover insulating layer 126b is formed by etching the semiconductor substrate 110 from the first surface 110F of the semiconductor substrate 110, the isolation insulating layer 124Ia is formed to fill the isolation trench 124Tb, and then, the process similar to that described with reference to FIGS. 14 and 15 is performed, such that the image sensor 104 illustrated in FIG. 8 can be manufactured.

In exemplary embodiments of the inventive concept, a preliminary semiconductor substrate is prepared to allow the semiconductor substrate 110 having the first surface 110F and the second surface 110B to further have a semiconductor layer on the second surface 110B. Afterward, a preliminary isolation trench is formed by penetrating the second surface 110B from the first surface 110F and partially penetrating through the preliminary semiconductor substrate, the semiconductor substrate 110 having the second surface 110B is formed by partially removing the preliminary semiconductor substrate, and thus, the isolation trench 124Tb that penetrates through the second surface 110B from the first surface 110F is formed. In this case, after the isolation trench 124Tb is formed, the cover insulating layer 126b covering the second surface 110B of the semiconductor substrate 110 may be formed.

A method of forming the image sensor 106 illustrated in FIG. 9 will now be described. The isolation trench 124Tb is formed. Afterward, the insulating liner 124Ib is formed to conformally cover the inner wall of the isolation trench 124Tb, the conductive buried layer 124Ca is formed to be filled on the insulating liner 124Ib in the isolation trench 124Tb, and then, the process similar to that described with reference to FIGS. 14 and 15 is performed, such that the image sensor 106 illustrated in FIG. 9 can be manufactured.

Afterward, the first inner wiring structure 130 and the first interlayer insulating layer 134 covering the first inner wiring structure 130 may be formed on the first surface 110F of the semiconductor substrate 110.

Figure 18:
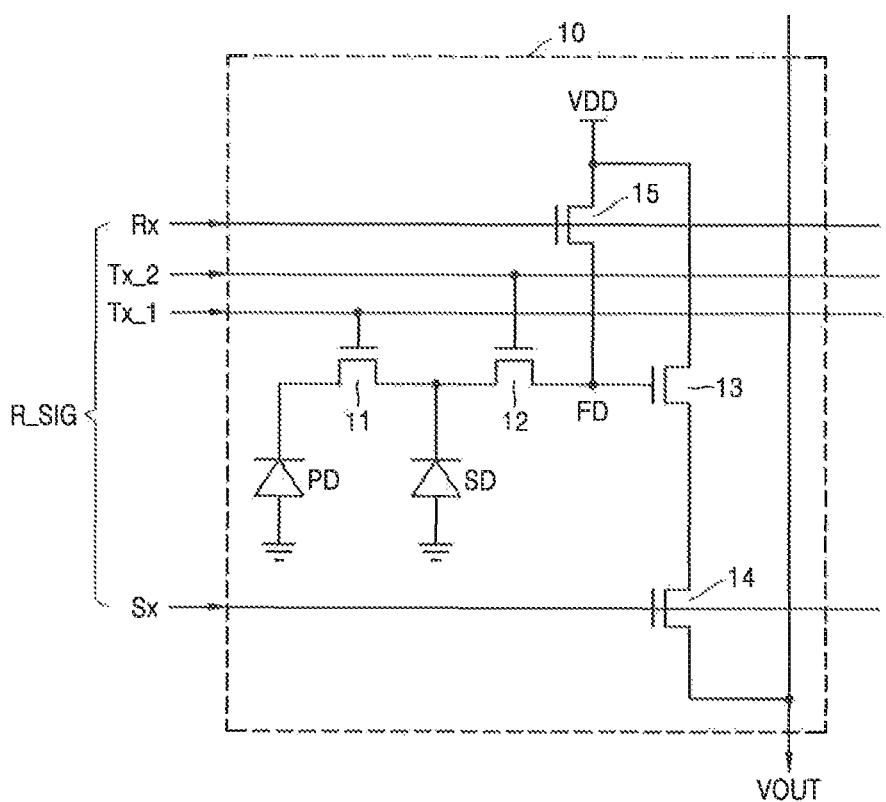
FIG. 18 is a circuit diagram illustrating a unit pixel included in an image sensor, according to an exemplary embodiment of the inventive concept.

FIG. 18 is a circuit diagram illustrating a unit pixel 10 included in an image sensor, according to an exemplary embodiment of the inventive concept.

Referring to FIG. 18, the unit pixel 10 may receive an input of a row signal R_SIG from the outside and may output an output voltage VOUT to the outside. The row signal R_SIG may be applied to respective gates of transistors to control the transistors included in the unit pixel 10 and may include a reset signal Rx, first and second transmission signals Tx_1 and Tx_2, and a selection signal Sx. The output voltage VOUT may be determined according to the intensity of light sensed by the unit pixel 10.

The unit pixel 10 may include a photo sensing device PD, a charge storing device SD, a first transmitting transistor 11, a second transmitting transistor 12, a source-follower transistor 13, a selecting transistor 14, and a reset transistor 15. The unit pixel 10 may include a floating diffusion region FD that is a node where the second transmitting transistor 12, the source-follower transistor 13, and the reset transistor 15 are electrically connected to each other.

The photo sensing device PD may absorb light and convert the light into an electrical signal and may be a photodiode, a photogate, a phototransistor, or the like. The charge storing device SD may temporarily store charges accumulated by the photo sensing device PD and may be a capacitor, a diode, or the like. FIG. 1 illustrates an example where the photo sensing device PD is a photodiode, and the charge storing device SD is a diode, but the inventive concept is not limited thereto.

The first transmitting transistor 11 may transmit the charges accumulated by the photo sensing device PD to the charge storing device SD or may block the charges, in response to the first transmission signal Tx_1. For example, while the photo sensing device PD absorbs light and accumulates charges, the first transmission signal Tx_1 having a voltage to turn off the first transmitting transistor 11 may be applied to a gate of the first transmitting transistor 11. The second transmitting transistor 12 may pass charges stored in the charge storing device SD to the floating diffusion region FD or may block the charges, in response to the second transmission signal Tx_2. For example, to output the charges stored in the charge storing device SD to the outside of the unit pixel 10 via the floating diffusion region FD, the second transmission signal Tx_2 having a voltage to turn on the second transmitting transistor 12 may be applied to a gate of the second transmitting transistor 12.

The source-follower transistor 13 may amplify a voltage of the floating diffusion region FD, and the selecting transistor 14 may selectively output the amplified voltage, in response to the selection signal Sx. The reset transistor 15 may connect or disconnect a power voltage VDD to the floating diffusion region FD, in response to the reset signal Rx, and thus, may set a voltage of the floating diffusion region FD as a reset voltage close to the power voltage VDD. The unit pixel 10 including elements for amplifying an electrical signal obtained by converting light absorbed by the photo sensing device PD may be referred to as an active pixel sensor (APS). The embodiments of the inventive concept may be applied not only to the unit pixel 10 illustrated in FIG. 18 but may also be applied to another APS including the photo sensing device PD and the charge storing device SD.

One photoelectric conversion region 120 described with reference to FIGS. 1 to 17 may configure all or some parts of the unit pixel 10, and the photodiode region 122 may correspond to the photo sensing device PD.

Figure 19:
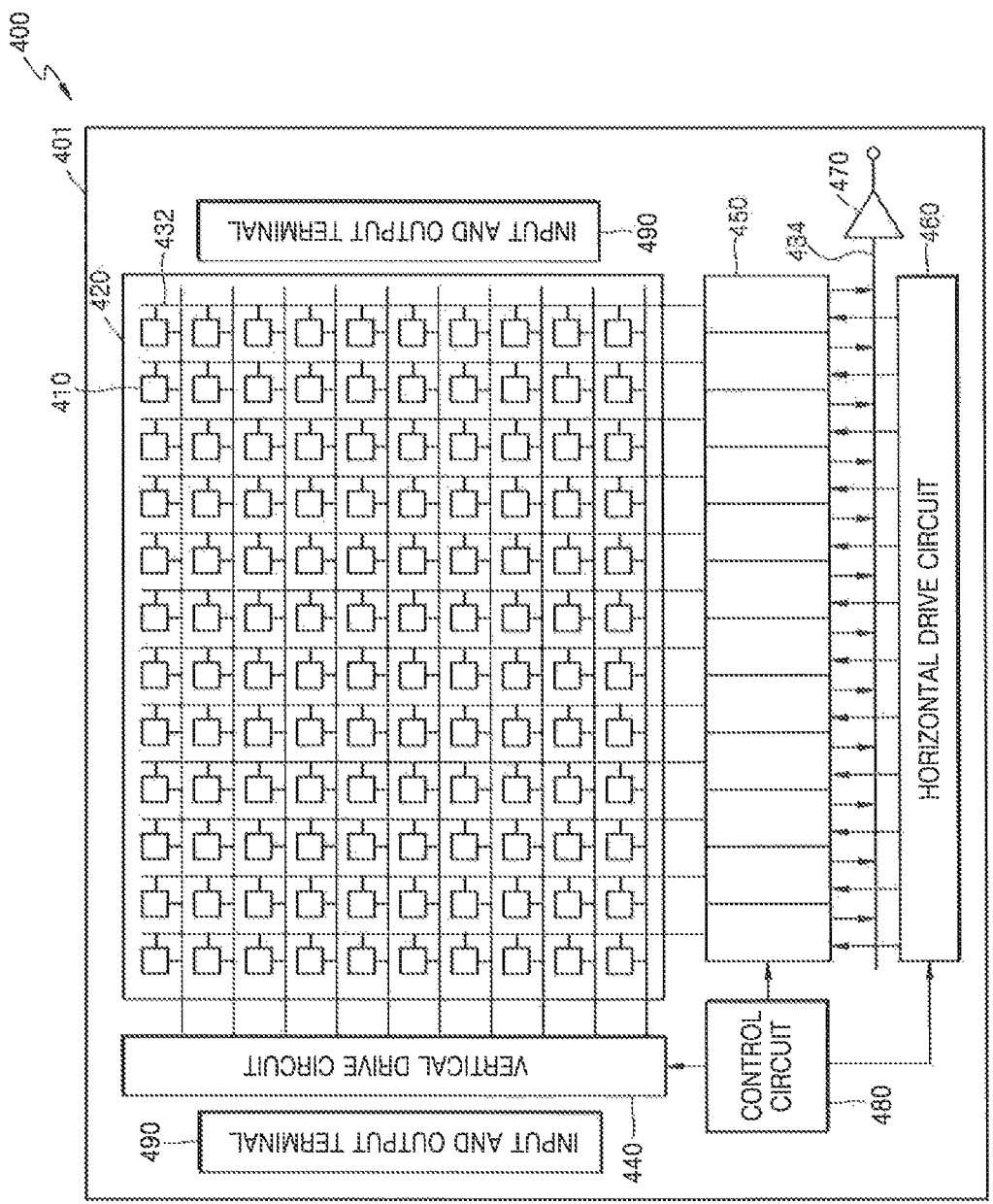
FIG. 19 is a block diagram illustrating an image sensor, according to an exemplary embodiment of the inventive concept.

FIG. 19 is a block diagram illustrating a configuration of an image sensor 400 according to an exemplary embodiment of the inventive concept.

Referring to FIG. 19, the image sensor 400 according to the present embodiment may include a pixel part 420 and a peripheral circuit part. The pixel part 420 may be provided such that a plurality of pixels 410 each including a photoelectric conversion device are regularly arranged in a two-dimensional array structure on a semiconductor substrate 401. The photoelectric conversion device may be a photodiode.

One photoelectric conversion region 120 described with reference to FIGS. 1 to 17 may configure all or some parts of each of the plurality of pixels 410, and the photodiode region 122 may correspond to the photoelectric conversion device.

The peripheral circuit part may be arranged in a peripheral area of the pixel part 420 and may include a vertical drive circuit 440, a column signal processing circuit 450, a horizontal drive circuit 460, an output circuit 470, a control circuit 480, or the like.

The control circuit 480 may control the vertical drive circuit 440, the column signal processing circuit 450, the horizontal drive circuit 460, or the like. For example, the control circuit 480 may generate a clock signal or control signals, based on a vertical synchronization signal, a horizontal synchronization signal, and a master clock signal, wherein operations of the vertical drive circuit 440, the column signal processing circuit 450, the horizontal drive circuit 460, or the like are based on the clock signal or the control signals. In addition, the control circuit 480 may input the clock signal or the control signals to the vertical drive circuit 440, the column signal processing circuit 450, the horizontal drive circuit 460, or the like.

The vertical drive circuit 440 may be configured as a shift register, may select a pixel drive line, and may drive pixels in a unit of rows by supplying a pulse to drive the pixels connected to the selected pixel drive line. For example, the vertical drive circuit 440 may selectively and sequentially scan the pulse to each of the pixels 410 of the pixel part 420 in a unit arrows in a vertical direction. In addition, the vertical drive circuit 440 may allow a pixel signal to be supplied to the column signal processing circuit 450 via a vertical signal line 432, wherein the pixel signal is provided in response to charges generated by a photodiode, e.g., the photoelectric conversion device of each of the plurality of pixels 410.

The column signal processing circuit 450 may be arranged at each column of the pixels 410 and may perform signal processing such as noise removal on a signal output from one row of the pixels 410 for each column. For example, the column signal processing circuit 450 may perform signal processing such as correlated double sampling (CDS), signal amplification, analog-to-digital conversion, or the like to remove noise of a signal from each pixel 410. A horizontal selection switch may be provided at an output end of the column signal processing circuit 450.

The horizontal drive circuit 460 may be configured as a shift register, may sequentially select each of the column signal processing circuits 450 by sequentially outputting a horizontal scan pulse, and may output respective pixel signals from the column signal processing circuits 450 to a horizontal signal line 434.

The output circuit 470 may perform signal processing on signals supplied from respective column signal processing circuits 450 via the horizontal signal line 434 and may output the signals. For example, the output circuit 470 may perform only buffering or may perform black level adjustment, non-uniform column correction, various digital signal processing operations, or the like. Input and output terminals 490 may exchange a signal with an external source.

While the inventive concept has been particularly shown and described with reference to exemplary embodiments thereof, it will be understood by those of ordinary skill in the art that various changes in form and details may be made thereto without departing from the scope of the inventive concept.

What is claimed is:

1. An image sensor, comprising:
a semiconductor substrate having a first region and a second region;
an isolation region filling first and second isolation trenches that partially penetrate the semiconductor substrate, wherein the isolation region includes an insulating liner formed on an inner wall of each of the first and second isolation trenches and a buried insulating layer disposed on the insulating liner and filling the first and second isolation trenches, the buried insulating layer completely covering a surface of the semiconductor substrate between the first and second isolation trenches;
a plurality of photoelectric conversion regions defined by the isolation region and forming a first hexagonal array on a plane that is parallel to a surface of the semiconductor substrate; and
a plurality of microlenses respectively corresponding to the plurality of photoelectric conversion regions, and forming a second hexagonal array on the plane that is parallel to the surface of the semiconductor substrate,
wherein a center of each of a first photoelectric conversion region of the plurality of photoelectric conversion regions and a first microlens of the plurality of microlenses corresponding to the first photoelectric conversion region overlap each other in the first region, and a center of each of a second photoelectric conversion region of the plurality of photoelectric conversion regions and a second microlens of the plurality of microlenses corresponding to the second photoelectric conversion region do not overlap each other in the second region.

2. The image sensor of claim 1, wherein the plurality of photoelectric conversion regions are arranged along a first direction parallel to the surface of the semiconductor substrate, and the plurality of microlenses are arranged along the first direction.

3. The image sensor of claim 2, wherein the center of the first photoelectric conversion region and the center of the first microlens correspond to a first line passing through the first photoelectric conversion region and the first microlens along a second direction perpendicular to the first direction.

4. The image sensor of claim 3, wherein the center of second photoelectric conversion region corresponds to a second line passing through the second photoelectric conversion region along the second direction, and the center of second microlens corresponds to a third line passing through the second microlens along the second direction, wherein the second and third lines are spaced apart from each other in the first direction.

* * * * *